(12) United States Patent
Mi et al.

(10) Patent No.: US 11,276,799 B2
(45) Date of Patent: Mar. 15, 2022

(54) MONOLITHICALLY INTEGRATED INGAN/GAN QUANTUM NANOWIRE DEVICES

(71) Applicant: The Regents of the University of Michigan, Ann Arbor, MI (US)

(72) Inventors: Zetian Mi, Ann Arbor, MI (US); Yong-Ho Ra, Montreal (CA); Renjie Wang, Montreal (CA)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 0 days.

(21) Appl. No.: 16/912,372

(22) Filed: Jun. 25, 2020

(65) Prior Publication Data
US 2020/0328326 A1 Oct. 15, 2020

Related U.S. Application Data

(63) Continuation of application No. 15/629,715, filed on Jun. 21, 2017, now Pat. No. 10,734,545.

(51) Int. Cl.
| | |
|---|---|
| *H01L 33/06* | (2010.01) |
| *H01L 33/32* | (2010.01) |
| *H01L 33/00* | (2010.01) |
| *H01L 33/24* | (2010.01) |
| *H01L 27/15* | (2006.01) |
| *H01L 33/18* | (2010.01) |
| *H01L 33/08* | (2010.01) |
| *H01L 33/62* | (2010.01) |
| *H01L 33/38* | (2010.01) |
| *H01L 33/20* | (2010.01) |

(52) U.S. Cl.
CPC ............ *H01L 33/06* (2013.01); *H01L 27/15* (2013.01); *H01L 27/156* (2013.01); *H01L 33/0025* (2013.01); *H01L 33/0075* (2013.01); *H01L 33/18* (2013.01); *H01L 33/24* (2013.01); *H01L 33/32* (2013.01); *H01L 33/007* (2013.01); *H01L 33/08* (2013.01); *H01L 33/20* (2013.01); *H01L 33/38* (2013.01); *H01L 33/62* (2013.01); *H01L 2933/0016* (2013.01)

(58) Field of Classification Search
CPC ....... H01L 31/072; H01L 33/24; H01L 33/42; H01L 33/04
See application file for complete search history.

(56) References Cited

U.S. PATENT DOCUMENTS

| | | | |
|---|---|---|---|
| 2011/0204327 A1 | 8/2011 | Hiruma et al. | |
| 2012/0061641 A1 | 3/2012 | Seong et al. | |
| 2013/0240348 A1 | 9/2013 | Mi et al. | |
| 2013/0270517 A1 | 10/2013 | Nozawa et al. | |
| 2014/0363912 A1* | 12/2014 | Ohlsson | H01L 33/30 438/35 |

* cited by examiner

*Primary Examiner* — Changhyun Yi

(57) ABSTRACT

InGaN/GaN quantum layer nanowire light emitting diodes are fabricated into a single cluster capable of exhibiting a wide spectral output range. The nanowires having InGaN/GaN quantum layers formed of quantum dots are tuned to different output wavelengths using different nanowire diameters, for example, to achieve a full spectral output range covering the entire visible spectrum for display applications. The entire cluster is formed using a monolithically integrated fabrication technique that employs a single-step selective area epitaxy growth.

10 Claims, 17 Drawing Sheets

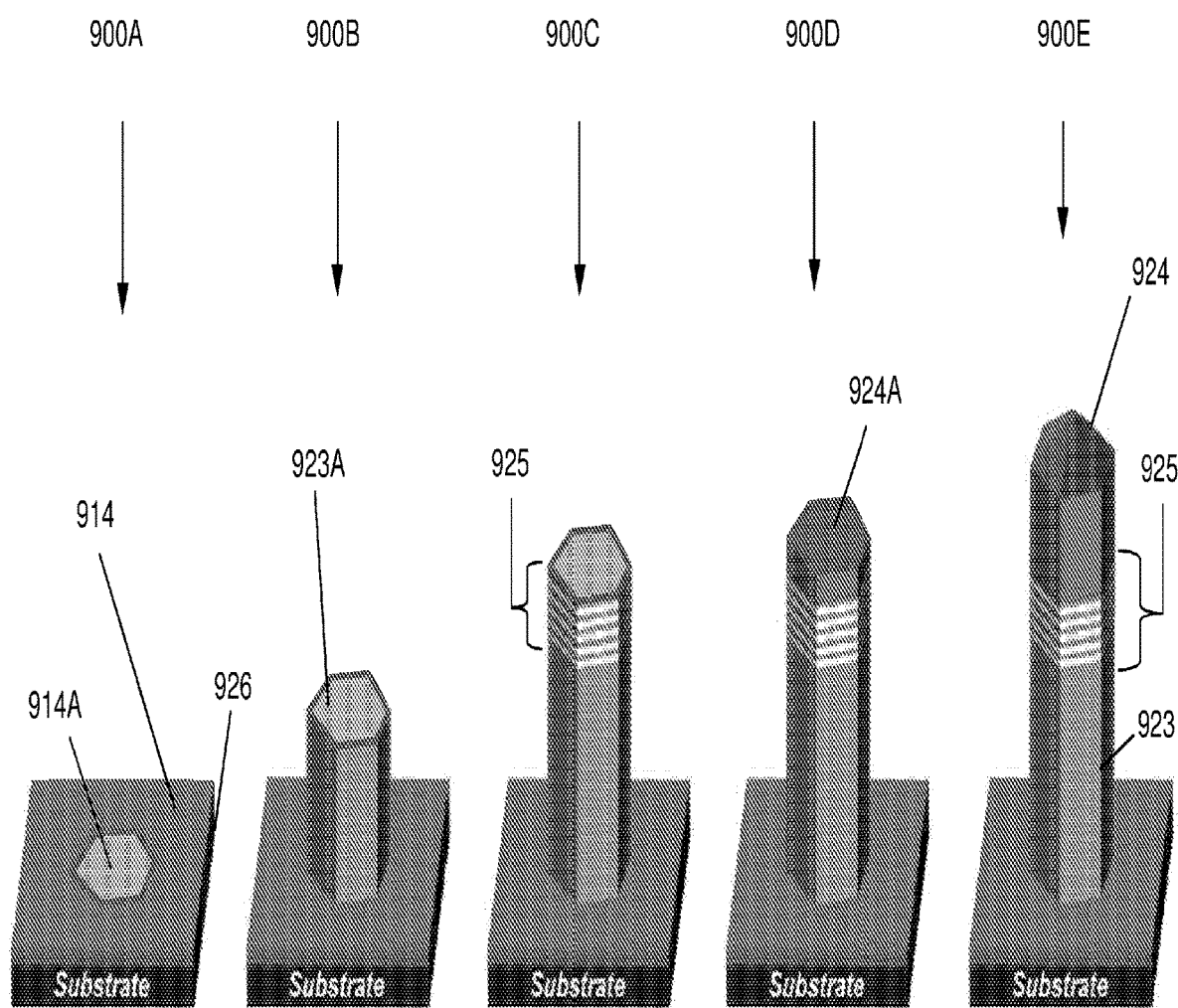

MONOLITHICALLY INTEGRATED INGAN/GAN QUANTUM NANOWIRE DEVICES

This application is a continuation application of U.S. patent application Ser. No. 15/629,715, filed April Jul. 21, 2017, which is hereby incorporated by reference in its entirety.

FIELD OF THE DISCLOSURE

The present disclosure relates to solid-state semiconductor devices and, more specifically, to semiconductor-based quantum nanowire devices formed of InGaN/GaN quantum structures.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Driven by the need for smaller size, reduced power consumption, and enhanced efficiency and functionality, future ultrahigh resolution display technologies require the development of submicron-scale, high-efficiency, multicolor light sources monolithically integrated on a single chip. The challenges of organic light emitting diodes (OLEDs) for these applications include limited lifetime of organic materials, relatively expensive manufacturing process, low efficiency and brightness, and poor stability. Moreover, it has remained difficult to achieve micro-scale or nano-scale devices using organic materials.

GaN-based quantum well Light Emitting Diodes (LEDs) are bright,stable and efficient, but usually only emit in one color. It has also remained difficult to achieve efficient deep green and red emission using GaN-based quantum well LEDs. Additionally, there is no established technology to spatially vary Indium (In) compositions in quantum wells to achieve multicolor emission on the same substrate.

Recent studies have shown that such critical challenges can be potentially addressed by using InGaN nanowire structures. Nanowire LED heterostructures exhibit low dislocation densities and high light extraction efficiency. GaN-based nanowire LEDs and lasers operating in the ultraviolet (UV), blue-green, and red wavelength range have been demonstrated.

Furthermore, it has been shown that multicolor emission can be achieved from InGaN nanowire arrays monolithically integrated on a single chip. It is further envisioned that display technologies based on pixels of single nanowire LED arrays integrated on the same chip represent the ultimate light sources for the emerging three-dimensional (3D) projection display, flexible display, and virtual retinal display (VRD) technologies. The radiation pattern and emission direction can be well-controlled and tailored by the columnar structure of each single nanowire, which is essential to achieving ultrahigh definition displays. In addition, pixels of single nanowire-based LED arrays can be much more efficient in heat dissipation and can operate at extremely large injection current levels. Critical to these technology developments is the demonstration of full-color, tunable light sources including LEDs and lasers using single, or a few nanowires on the same chip. This requires a precise tuning of alloy compositions in different nanowire structures and that these compositional variations should be ideally introduced in a single growth/synthesis step.

It was previously demonstrated in prior art that it was possible to produce multiple colors by varying the diameters of nanowires that are in a densely packed array in a one-step selective area epitaxy, that is, without changing the global growth parameters of the crystal growth process and system. However to make arrays, on the same chip, that emit in multiple colors the process had to be done in a multi-step selective area epitaxy process. This approach, as used in the fabrication of densely packed nanowire arrays, takes advantage of the shadowing effect of neighboring nanowires to alter the InGaN composition in densely packed array of nanowire structures. To date, however, little is known about the mechanism on how to controllably vary the alloy compositions at the single nanowire level without changing the global growth parameters. The monolithic integration of multicolor, single nanowire LEDs on the same chip has thus remained elusive.

It is desirable, and extremely challenging, to be able to fabricate a semiconductor-based light-emitting photonic device that has all the following attributes. Successful realization of a product that truly has all the characteristics which are listed below has been one of the holy grails of the photonics industry for several decades now. These devices have many applications in various products such as for example high-resolution and true-color displays that are used in applications such as computer screens, mobile phone screens, and high-definition televisions.

SUMMARY OF THE INVENTION

The present techniques include methods of fabricating solid-state semiconductor devices formed of nanowires, monolithically integrated as a single, repeatable cluster. The fabrication techniques are able to form these clusters having nanowires of different diameters, each capable of emitting at a different peak wavelength, such that the enter cluster is able to provide an output over a range of frequencies, such as over the entire visible spectrum. Each cluster may be formed as a single, repeatable chip like structure that may be fabricated in large scale applications, for example to form a digital display having a large array of these clusters.

The nanowire devices herein are based on a Gallium Nitride (GaN) material system, the crystalline structure of which can be grown on either a Silicon (Si) or Sapphire substrate which is a type of Aluminum oxide mineral. The nanowires are formed of quantum structures formed of Indium Gallium Nitride (InGaN) and Gallium Nitride (GaN) layers, i.e., InGaN/GaN layers. The InGaN/GaN layers form the active region of the nanowire structures and are quantum layers that may be formed of quantum dots, quantum disks, quantum arch-shaped structures, quantum semi-polar planes, quantum wells, quantum dots with a shell, or other similar quantum structures or combination thereof. As electrons combine with holes in the active region of each nanowire, photons are generated at specific wavelengths. The precise wavelength of the emitted photons depends on the specific composition of the InGaN/GaN quantum layers, as well as the shape and of the nanowire.

As the inventors have found, with the structural and optical properties of InGaN/GaN quantum layers depended upon nanowire diameter, a unique monolithically integrated fabrication may form InGaN/GaN nanowire light emitting diode (LED) devices that have a collective emission wavelength tunable across an entire spectral range (e.g., across a visible spectral range). By controlling the diameters of the nanowire structures and the percentage composition of In, Ga, and N in the respective InGaN/GaN quantum layers of the nanowires, it is now possible to engineer a cluster that emits over a tunable wide spectral range, by selecting the emitting wavelengths of each individual nanowire. Moreover, the monolithically integrated fabrication allows for precise control over the spacing between nanowire structures during fabrication, where that spacing, for the first time, allows for not only nanowires of different diameters, but also for the precise control over composition of elements in the quantum active regions, which otherwise would make it impossible to form a cluster having a wide emission spectral range.

In accordance with an example arrangement, provided is a device comprising a nanowire having, a lower portion formed of a first semiconductor comprising at least a group III element and doped to be n-type, a central portion formed of the first semiconductor comprising at least one quantum structure, and an upper portion of the first semiconductor comprising at least the group III element and doped to be p-type. The group III element may be gallium; and the first semiconductor material is gallium nitride. Further, the quantum structure may be a quantum active layer structure formed of one or more quantum layers of Indium Gallium Nitride/Gallium Nitride (InGaN/GaN), such as one or more InGaN/GaN quantum dot layers.

In accordance with another example arrangement, provided is a device comprising a plurality of stand-alone nanowires collectively formed as a cluster using a monolithically integrated fabrication technique, each nanowire having a different diameter and each nanowire emitting a photonic output at a different wavelength. An active layer in each nanowire may have a different semiconductor composition from that of each other nanowire. The device may be a multi-colored solid-state light source. Each nanowire may comprise a quantum active layer structure formed of one or more quantum layers of Indium Gallium Nitride/Gallium Nitride (InGaN/GaN), such as one or more InGaN/GaN quantum dot layers. Each nanowire may be a light emitting diode emitting at the different wavelength.

In accordance with another example, provided is a method of fabricating a semiconductor device, the method comprising: providing a substrate; depositing a metallic mask on the substrate, the metallic mask having a pattern of spaced apart openings, each of a different size; growing a plurality of stand-alone nanowires through application of an epitaxial crystal growth technique such that each nanowire has a different diameter determined by the size of one of the spaced apart openings; and forming each nanowire to have a quantum active layer structure, such that each nanowire is configured to emit a photonic output at a different wavelength corresponding to the diameter of the nanowire.

BRIEF DESCRIPTION OF THE DRAWINGS

This patent or application file contains at least one drawing executed in color. Copies of this patent or patent application publication with color drawing(s) will be provided by the United States Patent and Trademark Office upon request and payment of the necessary fee.

FIGS. 9A-9E show the schematic illustrations showing the formation of a single InGaN/GaN nanowire grown on GaN coated sapphire substrate. The images marked as FIGS. 9A to 9E illustrate an epitaxial crystal growth process corresponding to that of FIGS. 8A and 8B, in an example.

DETAILED DESCRIPTION

Figures 1A, 1B:
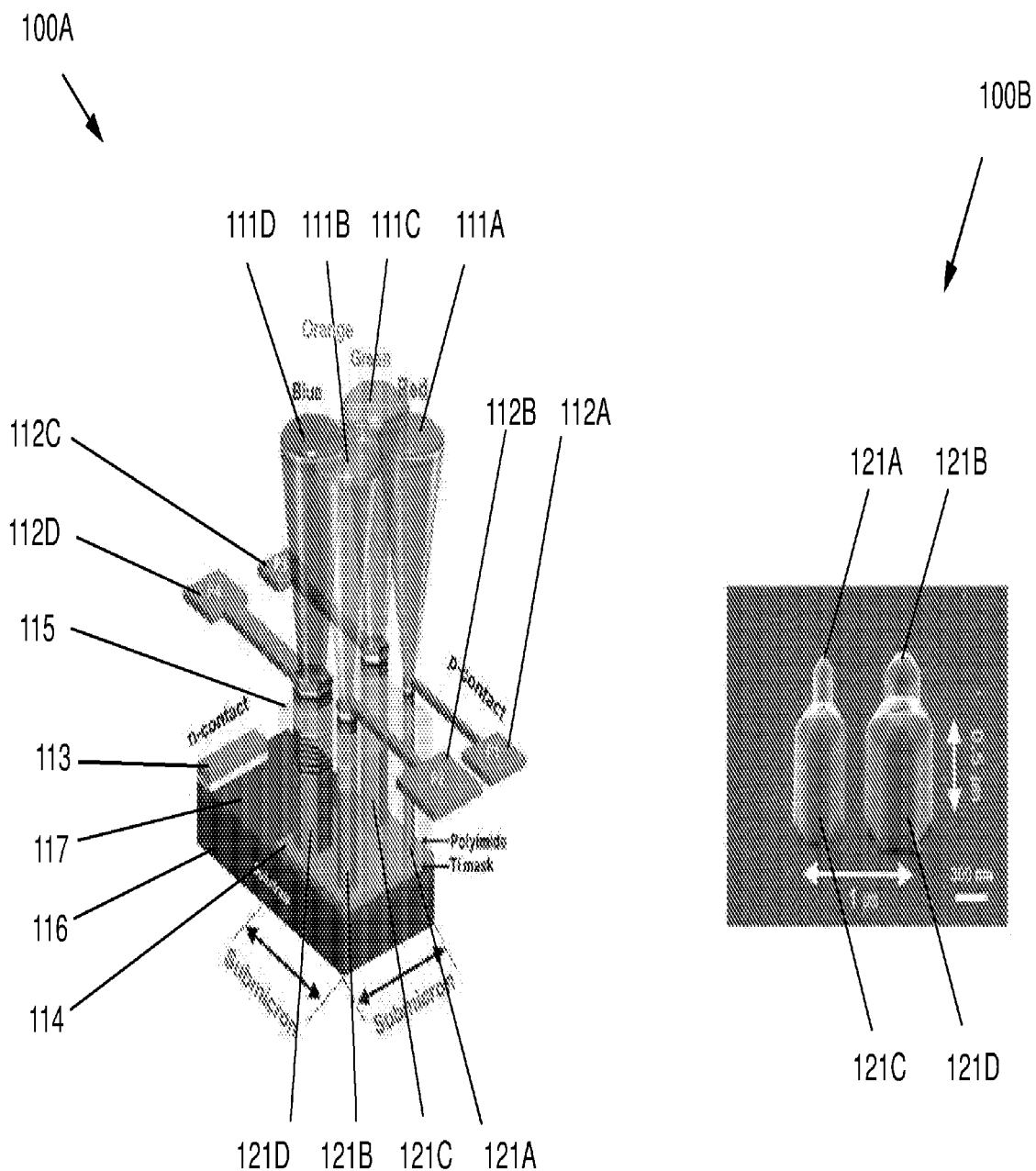
FIG. 1A illustrates a monolithically integrated InGaN/GaN quantum layer nanowire cluster, in accordance with an example.
FIG. 1B is an Scanning Electron Microscope (SEM) image of the InGaN/GaN quantum layer nanowire of FIG. 1A, showing with different nanowire diameters grown by selective area epitaxy, in accordance with an example.

The present techniques include methods of fabricating solid-state semiconductor nanowires and devices formed of the same. The nanowires are novel InGaN/GaN quantum layer active region nanowires. These nanowires may be fabricated as photon emitting devices, such as light emitting diodes (LEDs), or as photodetectors that absorb light at specified wavelengths. Techniques herein further describe tuning the wavelength of the photon output of nanowires by fabricating them at different diameter. Indeed, using a novel monolithically integrated fabrication process, a cluster of nanowires can be formed together into a single, repeatable cluster of nanowires each emitting at different, tuned wavelength. The fabrication techniques are able to form these clusters having nanowires of different diameters, each capable of emitting at a different peak wavelength, such that the entire cluster is able to provide an output over a range of frequencies, such as over the entire visible spectrum. Each cluster may be formed as a single, repeatable chip like structure that may be fabricated in large scale applications, for example to form a digital display having a large array of these clusters.

The InGaN/GaN quantum nanowire devices may be formed of nanowire structures of different diameters grown on the same substrate in one-step selective area epitaxy. Note that in this disclosure the terms "nanowire" and "nanowire structure" are used interchangeably.

Through detailed Scanning Transmission Electron Microscopy (STEM) studies, it is observed that the position, size, and composition of InGaN quantum dots depend on the nanowire diameter. For small diameter nanowires, quantum dots with high Indium (In) content are positioned at the center of the nanowires and are vertically aligned along the vertical axis of the nanowire. With increasing nanowire diameter, however, the formation of quantum dots with reduced indium content becomes more dominant on the semi-polar planes.

By exploiting such unique diameter-dependent quantum dot formation, we have shown that tunable emission across nearly the entire visible spectral range can be realized from stand-alone InGaN/GaN quantum layer active region nanowires, grown on the same substrate in a single epitaxy step. Those quantum layer active regions may be formed as quantum layers. These quantum layers may be formed of quantum dots, quantum discs, quantum wells, quantum dots/disks/wells with the presence of a shell structure, or the combination of similar structures.

The techniques herein are able to form nanowires isolated from one another in that each nanowire in a cluster is spaced far enough apart from each other nanowire so that the formation of each nanowire is unaffected by the formation of the other nanowires. This spacing distance allows the fabrication to grow each structure simultaneously with but independent of the growth of the other nanowires in the cluster. The result is that a single fabrication process forms nanowires of different diameters, which has never been done before, as well as nanowires of different atom concentrations in the active region, which too has never been done before.

A monolithically integrated cluster of stand-alone InGaN/GaN nanowires of various sizes have been fabricated on the same substrate by the crystal growth method of selective area epitaxy, also called selective area growth (SAG), using radio frequency Plasma-Assisted Molecular Beam Epitaxy (PA-MBE) technique which is one example of the epitaxy techniques that could be used to fabricate such structures. The epitaxy of the semiconductor layers takes place on an n-type GaN template on sapphire substrate with a thin (10 nm) titanium (Ti) layer being employed as the growth mask. Opening sizes in the range of 80 nm to 1.9 μm (1900 nm) were created on the Ti mask by using electron-beam (e-beam) lithography and reactive ion etching techniques, which can lead to a precise control of the diameters of the forming nanowires.

FIG. 1A shows the schematic illustration of a multi-color InGaN/GaN nanowire cluster 100A formed of stand-alone nanowires 121A, 121B, 121C, and 121D monolithically fabricated using a single-step selective area epitaxy growth technique. FIG. 1A illustrates the cluster 100A after completion of the fabrication process. In the illustrated example, the cluster 100A includes the four nanowires 121A, 121B, 121C, and 121D, although a cluster may be formed of any plurality of nanowire clusters (2, 3, 4, 5, 6, 7, 8, and so on).

Each nanowire 121A, 121B, 121C, and 121D has a different diameter from each other nanowire, thus establishing each nanowire as emitting at a different peak wavelength. However, in other examples, the cluster 100A may be formed of at least two nanowires having the same diameter, depending on the application. For example, in some examples two or more of the nanowires forming a cluster may have the same diameter and emit at the same wavelength. In some examples, multiple pairs of same diameter nanowires may be formed. Such clusters may be used, for example, to further increase intensity ranges over certain wavelengths emitted by a cluster.

In the cluster 100A, the nanowires 121A-121D are each hexagonal cross-section nanowires. With the present techniques, clusters may be formed of nanowires having cross sections of various shapes. For example, the cross sections could be cylindrical, hexagonal, rectangular, or triangular. The term diameter, as used herein, refer to the effective diameter of the structure. For example, for a hexagonal cross section nanowire, like 121A-121D, the diameter is the average of the major and minor axis of the hexagonal cross section of the nanowire.

The nanowires 121A-121D are grown above a GaN coated sapphire substrate 116. A GaN template layer 117 is deposited over the sapphire substrate 116, and deposited on top of the GaN template layer 117 is a Titanium (Ti) patterned mask 114, also referred herein as Ti mask, which has a precise set of openings on it. As discussed further below, the nanowire 121A, 121B, 121C, and 121D are grown on the GaN template layer 117, extending only through the openings in Ti mask 114. The cluster 100A may be packaged in a single chip device, for example, by applying a passivation layer 115 that fills the areas between the nanowire 121A-121D and that also serves as a planarization surface.

Each nanowire 121A-121D is capped with dedicated p-contact metallic laterally extending electrode 112A, 112B, 112C, and 112D, respectively, through which electric current is injected into each nanowire separately and independently. The electrodes 112A-112D provide independent control of the injection current into each individual nanowire 121A-121D, thereby allowing independent current and voltage control of each nanowire 121A-121D and independent control of parameters such as photonic output intensity. Opposite the electrodes 112A-112D, an n-contact metallization electrode 113 is deposited on the GaN template layer 117. Once electric current is injected into the different nanowires 121A-121D, each nanowire emits a photonic output 111A, 111B, 111C, and 111D, respectively. In the illustrated examples, that photonic output is at different respective wavelengths, each over a different region of the visible spectrum. In an arrangement, the output 111A is at ~659 nm (red), the output 111B is at ~625 nm (orange), the output 111C is at ~526 nm (green), and the output 111D is at ~461 nm (blue). These output wavelengths are provided by way of example, and in particular, in an example implementation of the cluster as full color display pixel. With the present techniques quantum active layer nanowires may be formed to emit at wavelengths within a range of frequencies, such as over visible wavelengths such as a violet spectral range of between at or about 380 nm to at or about 450 nm, a blue spectral range from at or about 450 nm to at or about 495 nm, a green spectral range from at or about 495 nm to at or about 570 nm, a yellow spectral range from at or about 570 nm to at or about 590 nm, an orange spectral range from at or about 590 nm to at or about 620 nm, and a red spectral range from at or about 620 nm to at or about 750 nm. These are provided by way of example, the output wavelengths may include wavelengths in the near infrared (~700 nm to 2500 nm) and mid infrared, as well as in the near ultraviolet (~380 nm to ~450 nm), mid ultraviolet (~280 nm to ~380 nm), or deep ultraviolet (~200 nm to ~280 nm). When formed as a photodetector, these wavelengths and spectral ranges would correspond to absorption wavelengths.

FIG. 1B shows an Scanning Electron Microscope (SEM) image of four nanowires each with a different diameter, grown on a substrate using a Ti mask as described further herein. The four nanowires 121A, 121B, 121C, and 121D, have been grown on the GaN coated sapphire substrate 116 using a crystal growth technique of selective area epitaxy, also referred to herein as a selective area growth (SAG) technique. The substrate does not necessarily need to be a sapphire substrate and could be other types of substrate such as Si, SiC, GaN, SiOx substrates and various metal substrates/templates. A more detailed discussion of an example fabrication process is discussed in reference to FIGS. 7A-7B below.

Figure 2:
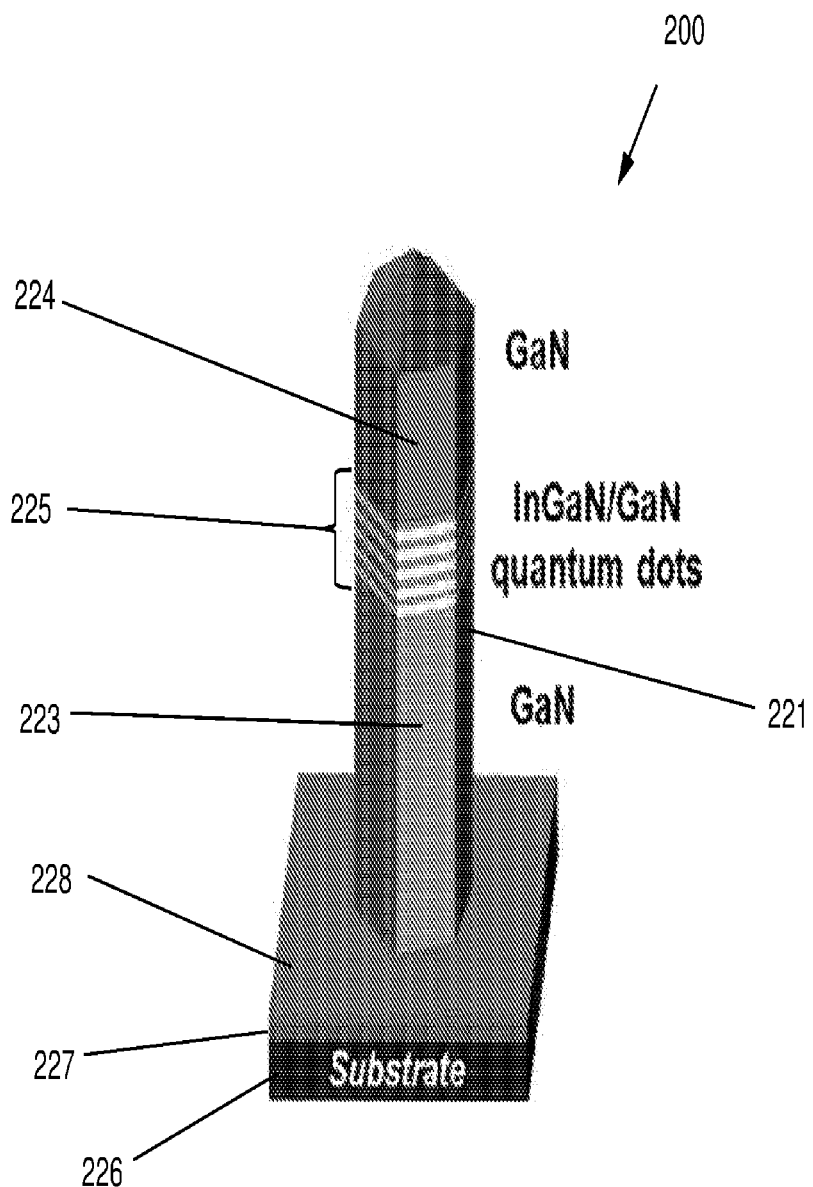
FIG. 2 illustrates a single InGaN/GaN nanowire grown on sapphire substrate, in accordance with an example.
Figure 3:
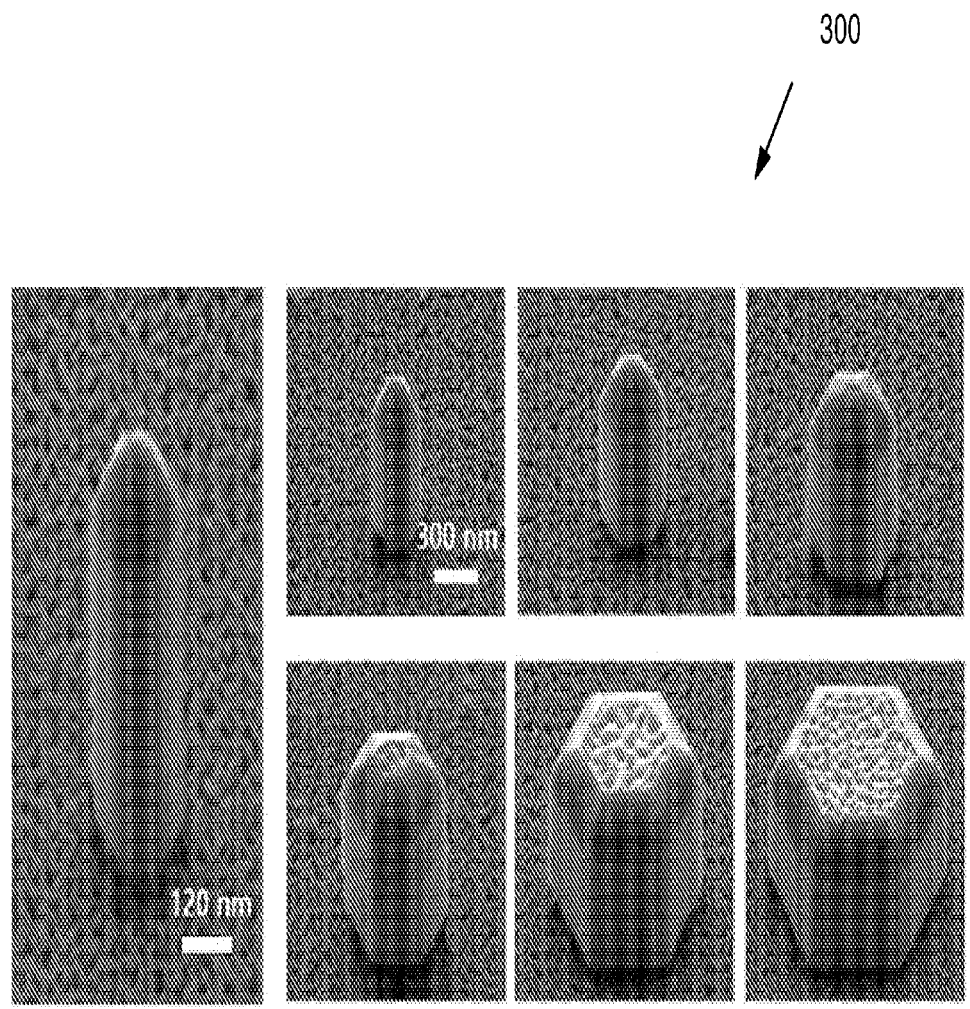
FIG. 3 illustrates SEM images of InGaN/GaN nanowires of various diameters, in accordance with an example.

In FIG. 2, a single nanowire 200, which may correspond to any of the nanowires 221A-221D, is shown. The nanowire is grown above a sapphire substrate 226 covered with a GaN template layer 227. In this illustrated example, the nanowire 221 is formed of a n-type GaN layer 223, a stack of vertically aligned InGaN/GaN quantum layers 225, and a p-type GaN capping layer 224. The quantum layers 225 may be formed of any number of alternating InGaN and GaN layers, where the number of layers affects the optical emission properties and where collectively these layers form an active region of the nanowire 221. In some examples herein the InGaN/GaN quantum layers are formed of quantum dots, that is an InGaN dot structure surrounded by a GaN or AlGaN filler. The layers 225 however may be formed of any number of quantum structures, including quantum dots, quantum discs, quantum wells, or similar structures. Furthermore, the nanowire 221 has a hexagonal (near perfect hexagonal) cross section. FIG. 3, for example, illustrates SEM images of nanowires formed of different diameters each exhibiting near-perfect hexagonal morphology and possessing Ga-polarity based on the terminating facets.

Figures 4A, 4B:
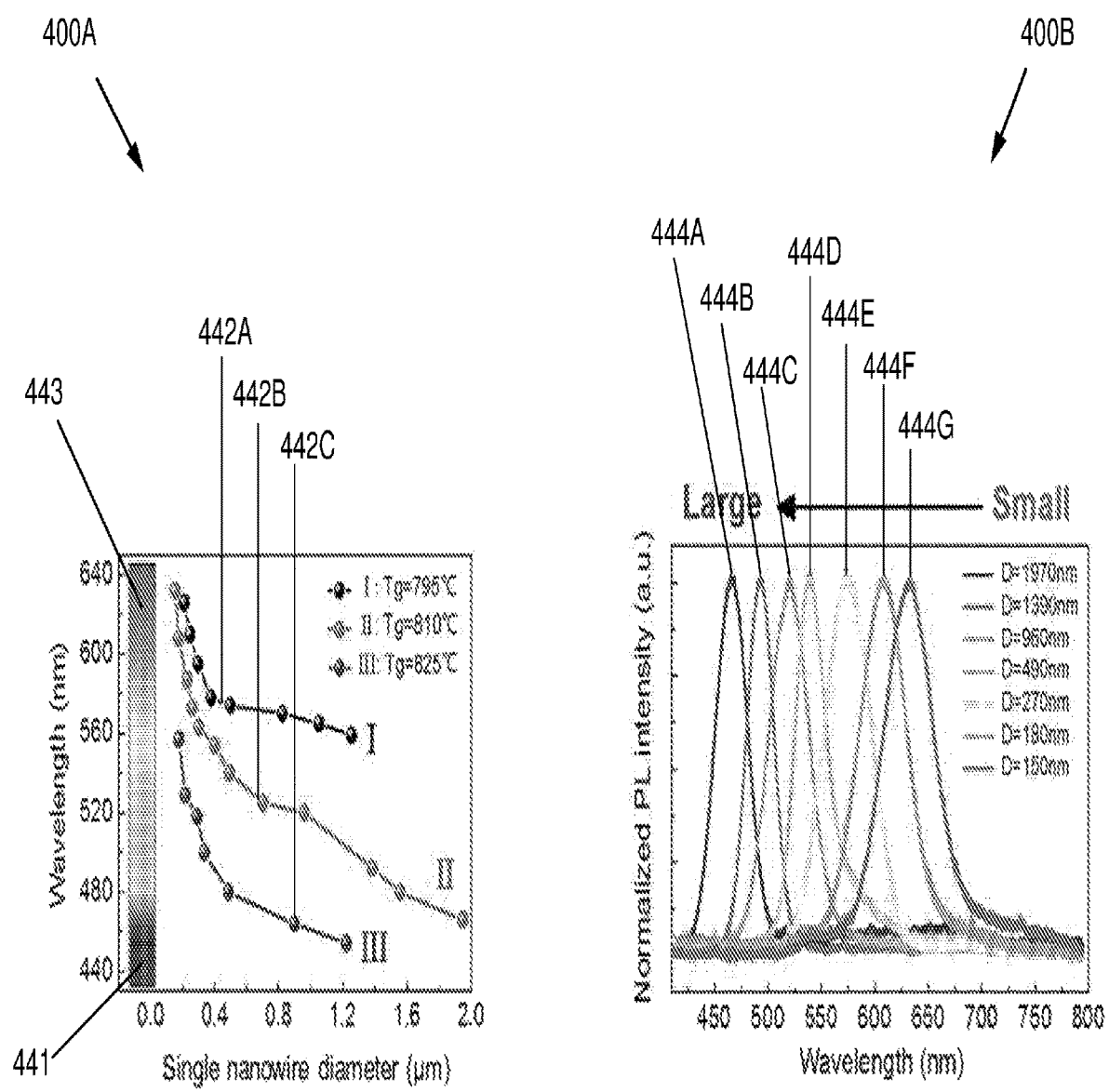
FIG. 4A is a plot of peak emission wavelength versus nanowire diameter for a InGaN/GaN nanowire with a quantum dot active region grown at the three different growth temperatures of 795° C. (Sample I), 810° C. (Sample II), and 825° C. (Sample III), in accordance with an example.
FIG. 4B is a plot of normalized Photoluminescence (PL) spectra versus wavelength for the InGaN/GaN quantum dot nanowires in Sample II, of FIG. 4A, with different diameters measured at room temperature, showing a blue-shift in the emission peak with increasing nanowire diameter, in accordance with an example.

The nanowires in FIG. 3 were grown using a Veeco GENxplor MBE system, which is only one example of the type of system that can be used for this purpose. The growth conditions, as an example, can include a substrate temperature of 1030° C. and a gallium (Ga) beam equivalent pressure (BEP) of $3 \times 10^{-7}$ Torr for the growth of the GaN segment of the nanowire. During process of growing the crystalline structure, the substrate temperature was reduced to 795° C., 810° C., and 825° C. for InGaN/GaN quantum dot active regions 25 in three different samples I, II, and III, respectively. In FIG. 4A the profiles 400A associated with three samples I, II, and III are indicated by the numerical indicators 442A, 442B, and 442C respectively. The growth temperature mentioned here refers to the thermocouple reading near the backside (coated with molybdenum and titanium) of the sapphire substrate. Indium and Gallium BEPs in the ranges of $1.2$-$1.5 \times 10^{-7}$ Torr and $5$-$7 \times 10^{-9}$ Torr were used for the growth of the quantum dot active regions in accordance with the example which is presented in this embodiment of the invention.

To confirm the output wavelengths emitted from these nanowires, photoluminescence (PL) emission was measured using a micro-PL measurement system at room-temperature with a 405 nm wavelength laser as the excitation source. The plots 440A and 400B of these PL measurement results are shown in FIGS. 4A and 4B What is shown in FIG. 4A are the measured variations of the peak emission wavelengths versus nanowire diameters. Nanowires were grown on the same substrate with identical epitaxy conditions, except that their lateral sizes, i.e., diameters D, were varied in the range of ~150 nm to ~2 μm (2000 nm) as shown in the SEM image of FIG. 3. As shown in FIG. 4A, the optical PL emission results show a consistent blue-shift with increasing nanowire diameter under identical epitaxy conditions. For nanowires in Sample II as an example, the emission wavelengths can be continuously varied from a red region 443 of the spectrum at around the wavelength of ~640 nm to a blue and violet region 441 of the spectrum at around the wavelength of ~465 nm by increasing the nanowire diameters from ~150 nm to ~2 μm (2000 nm) with otherwise identical epitaxy conditions. A similar trend is also observed for nanowires in Sample I and Sample III, though the tuning range is less broad due to variations in the growth conditions. The photoluminescence (PL) emission spectra for nanowires with different diameters are further shown in FIG. 4B and it is evident that the wavelength range of emission covers the entire visible range of the spectrum from violet all the way to red. These wavelength profiles have been shown in FIG. 4B by the numerical indicators 444A, 444B, 444C, 444D, 444E, 444F, and 444G.

Figures 5A, 5B, 5C:
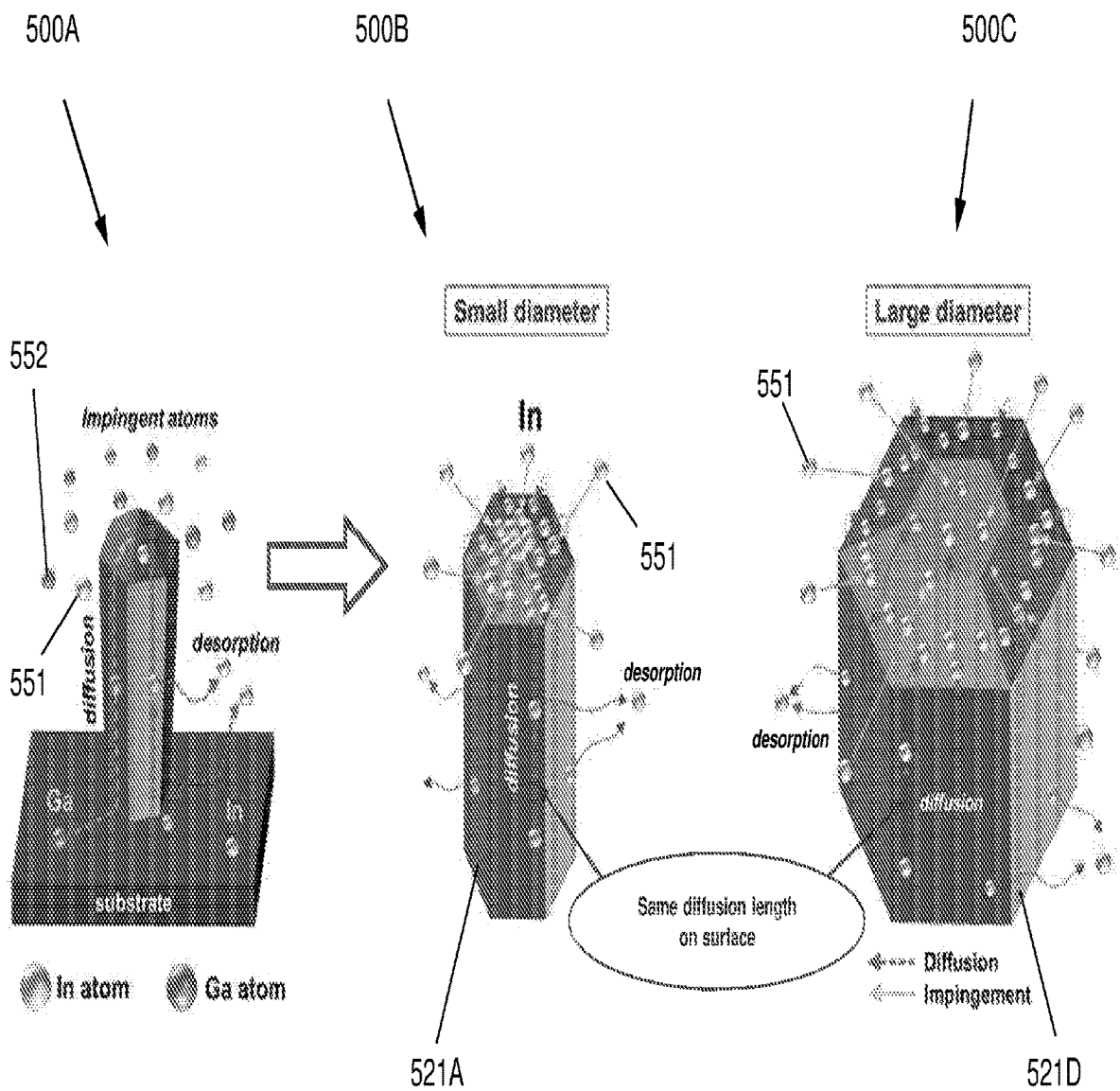
FIG. 5A illustrates a process of atom adsorption to the surface of a nanowire during a fabrication growth process. Note that the variation of Indium (In) content is largely determined by diameters of each single nanowire as shown schematically in FIG. 5B and FIG. 5C, in accordance with an example.
FIG. 5B illustrates a process of increased Indium (In) adatom incorporation due to lateral diffusion for small diameter nanowires, in accordance with an example.
FIG. 5C illustrates a process of reduced Indium (In) incorporation from lateral diffusion for large diameter nanowires, in accordance with an example.

The present techniques are able to advantageously control In, Ga, and N concentrations in the active regions of the nanowires and do so from a single growth epitaxy process. FIGS. 5A-5C illustrate portions of the nanowire fabrication process that incorporate In and Ga atoms into a grown nanowire. FIG. 5A illustrates the process of atom adsorption, which is the adhesion of atoms, ions, or molecules from a gas to the surface of a structure.

As shown, Indium (In) atoms 551 and Gallium (Ga) atoms 552 may be adhered to the nanowire 521A through an impingement upon an outer surface through the process of adatom (adsorbed atom) incorporation as shown in the illustrations of FIGS. 5A, 5B, and 5C. The In concentration is largely determined by the diameter of the nanowire. FIG. 5B, for example, shows a higher concentration of In in smaller diameter nanowires, and FIG. 5C shows a lower concentration in larger diameter nanowires. This process of adhesion of atoms to the surface structure of the nanowire formation is sometimes referred to as the "adatom incorporation process" with the word "adatom" meaning an atom that lies on the surface of a crystalline structure such as the nanowires being discussed herein.

As illustrated in FIG. 5A, compared to conventional planar epitaxy methods in which only two dimensional planar layers of crystal are formed parallel to each other along the direction of the growth, the adatom incorporation process is different in crystalline structures that include three dimensional formations such as the stand-alone nanowires. In the latter case, the crystal growth epitaxy process include atoms attaching themselves to the three dimensional structure through both a process of direct impingent atom adsorption from the top as well as the process of atoms migrating from the side and attaching themselves to the side walls of the nanowire from the lateral surfaces. In other words atoms get incorporated into the structure of the nanowire formation both from the top surface of the nanowire as well as from the side surfaces of the nanowire.

For example, in reference to FIGS. 5A-5C, under relatively high growth temperatures, Gallium (Ga) adatoms 552 (adsorbed atoms that attach themselves to the surface of the crystalline nanowires 521A and 521D) have much larger diffusion lengths of around ~1 μm (~1000 nm) than Indium (In) adatoms 551 with diffusion lengths around ~100 nm, with the latter limited by thermal desorption. Since the Ga diffusion length is comparable to, or larger than the nanowire diameters, it is expected that the Ga adatom 552 incorporation shows a small, or negligible dependence on nanowire size. However, significantly reduced Indium (In) incorporation is expected with increasing nanowire diameter, due to the reduced In adatom incorporation from lateral diffusion. In other words Gallium (Ga) atoms penetrate the nanowire much more deeply than the Indium (In) atoms. The diffusion length, which refers to adatoms surface migration distance before they are either desorbed or incorporated in the crystal, for In atoms is ~100 nm while that of Ga atoms is ~1000 nm which is about ten times more.

With increasing nanowire diameter, the reduced Indium adatom incorporation from lateral diffusion results in a reduced Indium content in thicker nanowires, since the Indium beam equivalent pressure (BEP) is the same across the entire wafer. As illustrated in FIGS. 5B and 5C, this means that nanowire that are relatively thicker will have an Indium atom deficiency at their core as compared to nanowires which are relatively thinner. For this reason, the composition of nanowires of different diameters will be different. As a result of different material composition, thinner nanowires with a higher Indium content at their core and will emit light of a shorter emission wavelength which will be more towards the red side of the visible spectrum. Thicker nanowires with a lower Indium content at their core will emit light of a longer emission wavelength which will be more towards the violet and blue side of the visible spectrum. As shown in the particular example of FIG. 1A, the thicker nanowire 121D and 121C are able to emitting at blue wavelengths and green wavelengths, respectively, lights while the thinner nanowires 121B and 121A are able to emit at orange and red color wavelengths.

In the case of the devices and the fabrication methods described herein, the variation of Indium content may be determined based on the diameters of the single stand-alone nanowires. This is because the nanowires are spaced relatively far from each other so that the formation of one nanowire during the crystalline growth process is not affected by its neighboring nanowires.

These results presented herein in this disclosure are distinctly different from those devices in which nanowires are formed in arrays with high packing density and analogous to a forest with densely packed growth of trees spaced very near to each other. If the nanowires are formed in a densely packed array, as opposed to single stand-alone ensemble of nanowires as described here, then the growth and the formation of each nanowire is affected by what is commonly referred to as the "shadowing effect". Under this alternate scenario the incorporation of both Indium and Gallium atoms into the structure of the nanowire is affected by the fact that the neighboring nanowire casts a shadow onto its neighboring nanowire and thus influences the mechanism through which Gallium and Indium atoms are diffused and incorporated into each nanowire. For this reason, in the formation of the devices discussed in this disclosure, the nanowires are spaced relatively far from each other in a fashion that is shown for example in FIG. 1B.

To further elucidate the mechanism of wavelength tuning, investigated in this work has been clusters of standalone InGaN/GaN nanowires with controllably varying spacing among the individual nanowires. A consistent red-shift with decreasing nanowire spacing is observed due to the reduced Gallium incorporation into the structure of the nanowire formations. This is related to the beam shadowing effect. Such beam shadowing effect, however, is not present for single nanowires that are part of a cluster of standalone nanowires. In other words, if the nanowires are spaced far enough from each other the undesirable shadowing effect and the resultant red-shift implication can be avoided.

A method of precisely controlling the spacing between the nanowires as well as a method of precisely controlling the diameter of each nanowire is described in this disclosure. This control of the fabrication process is exerted through the use of a Titanium patterning mask and the method of selective area epitaxy both of which will be described further on herein.

In order to identify the correlation between composition and structure of the InGaN/GaN quantum layer active region and the nanowire sizes, structural characterizations were performed using aberration-corrected Scanning Transmission Electron Microscope (STEM) which can be done using for example an FEI Titan Cubed 80-300 STEM system that is operated at a setting of 200 kV. In doing so a cross-sectional sample of nanowires of different diameters was prepared by focused ion beam (FIB) technique in a single lift-out process, followed by a milling process done at a setting of 30 kV using for example a Zeiss NVision 40 dual-beam system with deposited Pt (platinum), C (carbon), and W (tungsten) films as protection layers, and then perform a final polish of the sample at a setting of 5 kV. Having prepared the sample in this fashion it is then possible to produce STEM images of the nanowires and the core of these nanowires. These images are shown in FIGS. 6A and 6B.

Figure 6A:
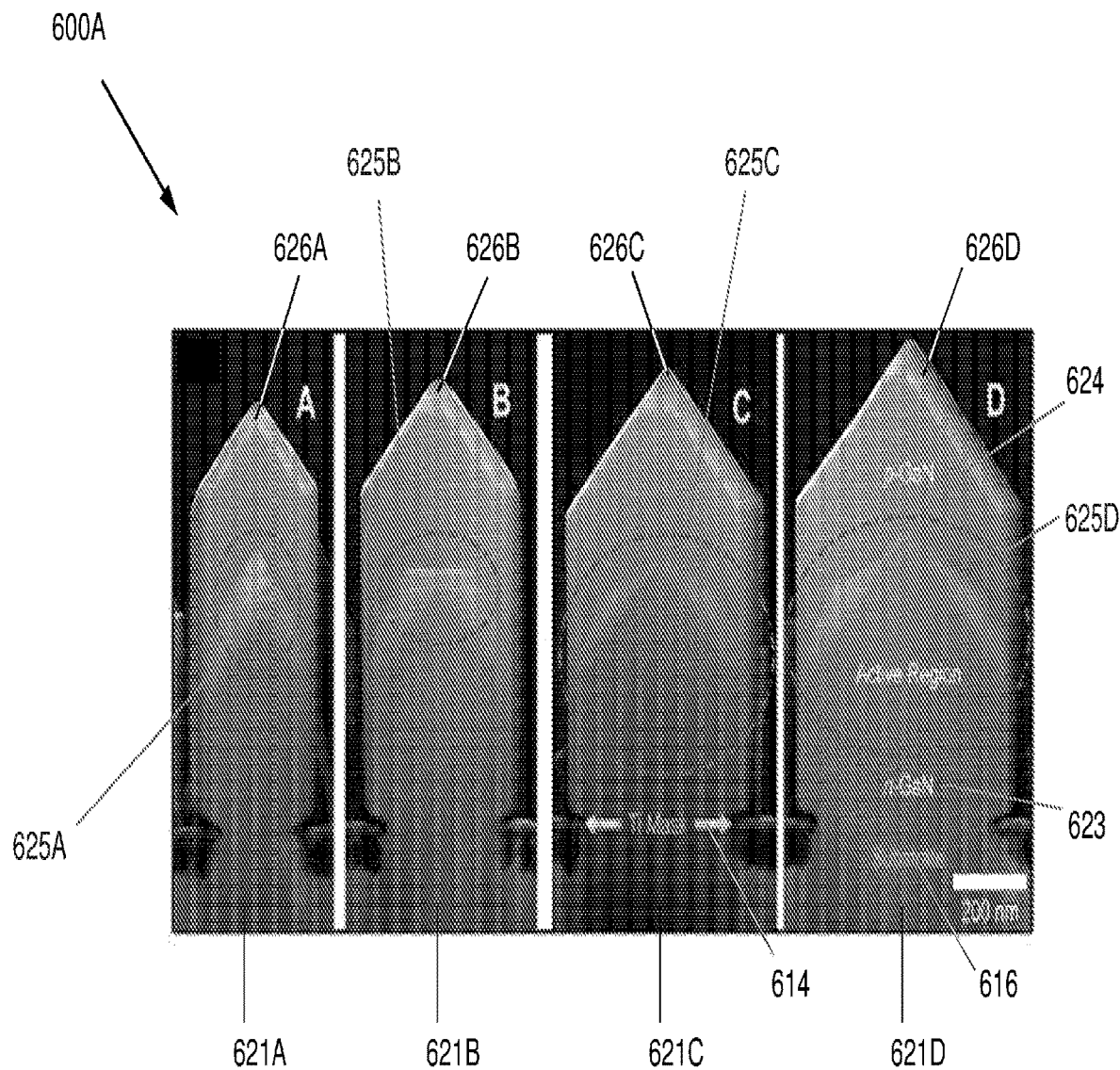
FIG. 6A illustrates STEM-HAADF (Scanning Transmission Electron Microscope-High-Angle Annular Dark-Field) images for InGaN/GaN quantum dot nanowires with different diameters grown on a GaN template on sapphire substrate along the <11$\overline{2}$0> zone-axis.

In FIG. 6A, the nanowires 621A-621D having active regions 625A-625D, respectively, each active region is a InGaN/GaN quantum layer active region and, more specifically, an active layer formed of stacks of InGaN/GaN quantum dot layers. In the illustrated examples, the nanowires 621A-621D have diameters of ~320 nm, ~420 nm, ~500 nm, and ~595 nm, respectively. As shown, the STEM structural analysis of FIG. 6A reveals the nature and growth mechanism of InGaN/GaN quantum dot nanowires of different nanowire diameters, through the High-Angle Annular Dark-Field (HAADF) atomic-number contrast images.

Figure 6B:
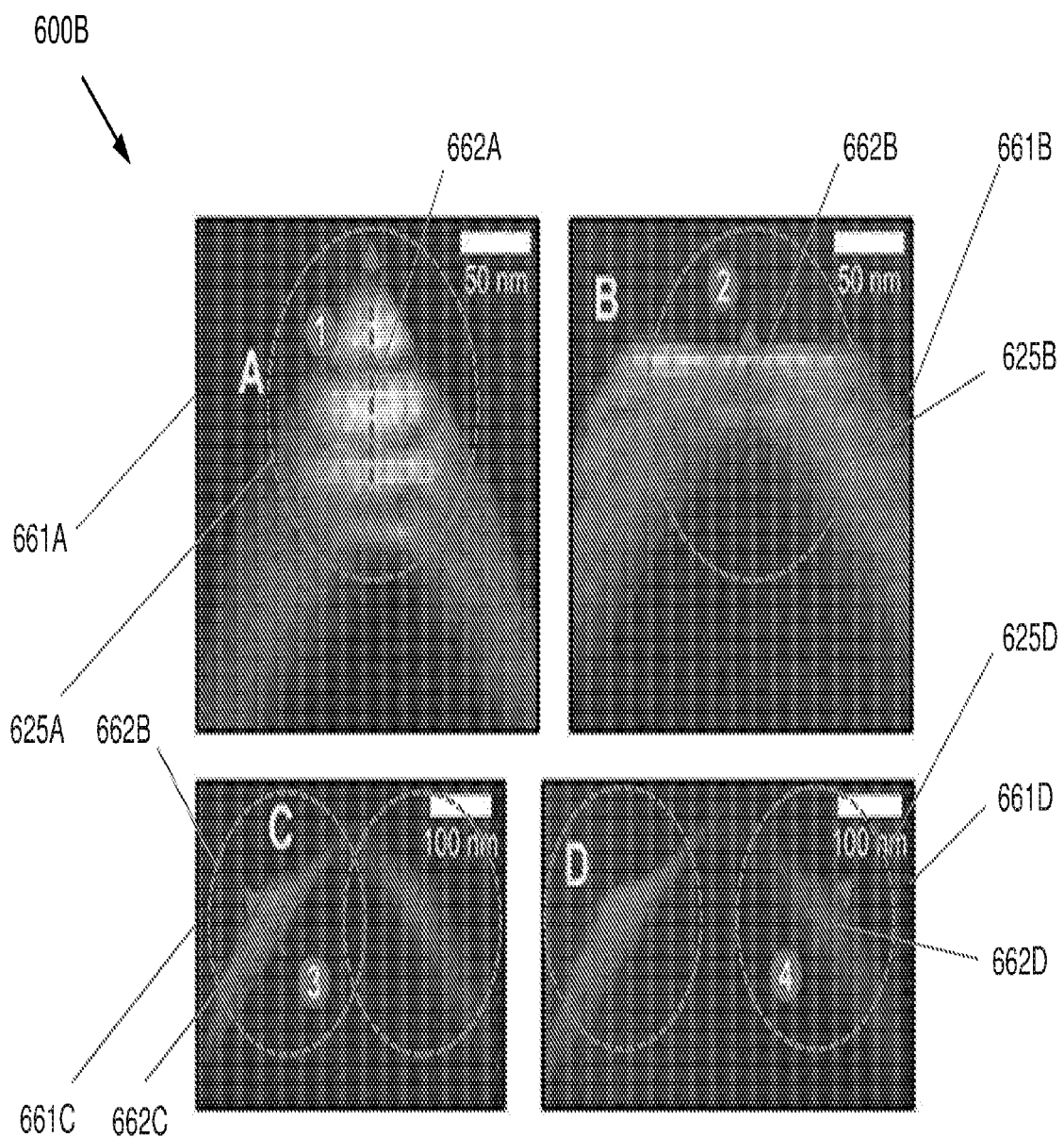
FIG. 6B illustrates high-resolution STEM-EELS (Scanning Transmission Electron Microscope-Electron Energy Loss Spectroscopy) maps of Indium distribution of active regions normalized to the sample thickness, in accordance with an example.
Figure 6C:
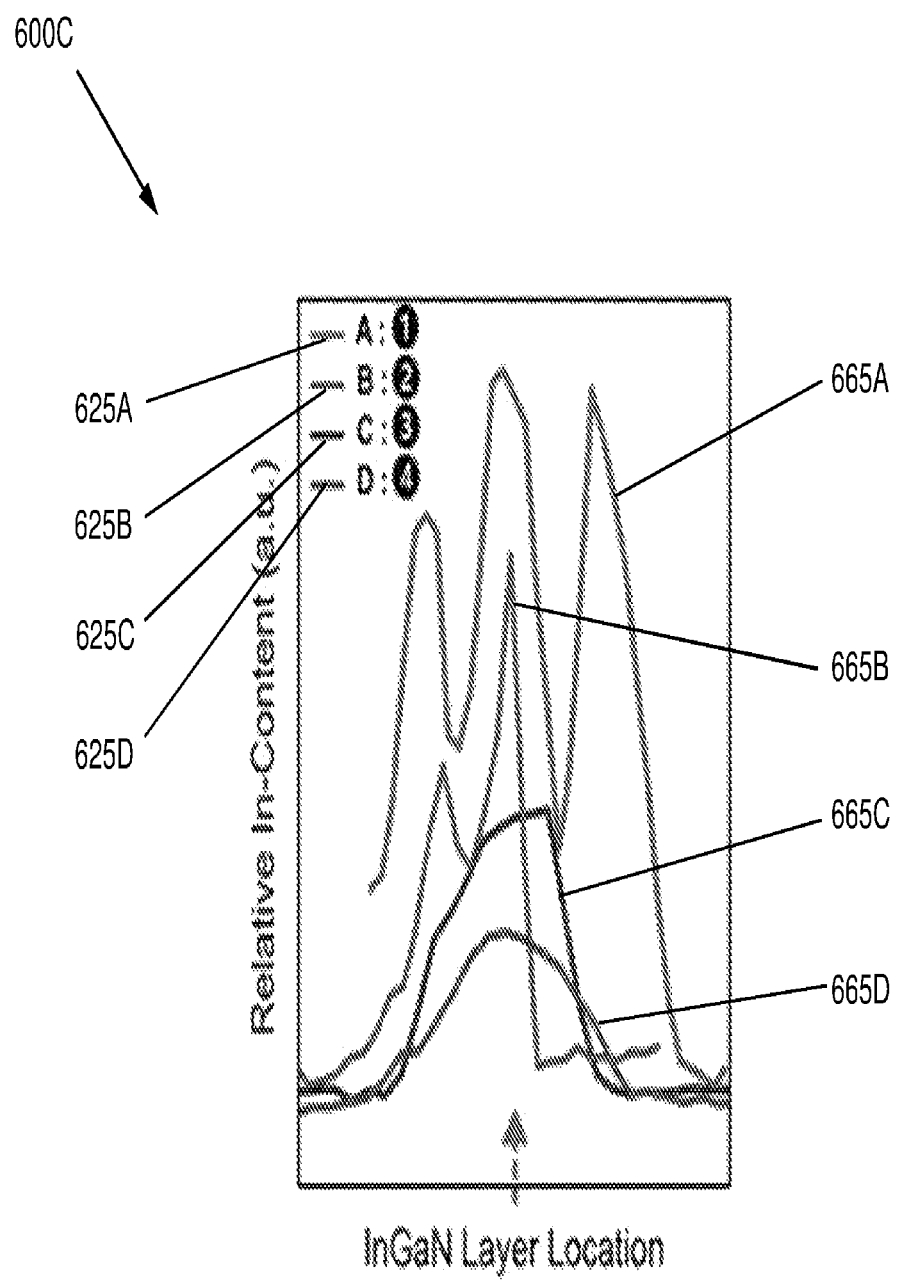
FIG. 6C is a plot of relative In content versus InGaN layer location derived from STEM-EELS (Scanning Transmission Electron Microscope-Electron Energy Loss Spectroscopy) analysis along different lines in FIG. 6B, in accordance with an example.

FIG. 6B illustrates high-resolution elemental mapping of Indium using STEM Electron Energy-Loss Spectroscopy (EELS) of the active regions 625A-625D corresponding to images 662A, 662B, 662C, and 662D. FIG. 6B illustrates Indium-distribution maps, identifying line profiles 1, 2, 3, and 4 (of active regions 625A-625D, respectively) which correspond to the plot of In content versus InGaN layer location shown in FIG. 6C. For the Indium-distribution maps of FIG. 6C, the regions with bright intensity are rich in Indium content, while the regions with dark intensity are Indium-deficient or Indium-free. For example regions of the structure that are Indium free are the n-GaN region at the bottom of the nanowire and the p-GaN at the top of nanowire.

In FIG. 6B, in the TEM images 662A, 662B, 662C, and 662D the InGaN quantum dots are visible at the center of the nanowires. Shown in the images 662A and 662B are the active regions 625A and 625B, which are vertically aligned along the vertical axis of the nanowire. With increasing nanowire diameter, instead of the formation of InGaN quantum dots at the center of the nanowires, InGaN accumulates at the semi-polar planes of nanowires, as shown in active regions 625C and 625D of images 662C and 662D, respectively. The larger the nanowire diameter, the more InGaN is distributed at the semi-polar planes compared to the center of nanowire which is the top of the n-GaN region. These observations indicate that Indium incorporation at the nanowire top surface shows strong dependence on nanowire diameter.

As shown, with increasing nanowire diameter the Indium content at the center of InGaN quantum dots decreases progressively. This result is consistent with the blue-shift of the PL peak position with increasing diameter of single nanowires, further supporting the growth mechanism of single nanowires by using the selective area epitaxy.

Figure 7A:
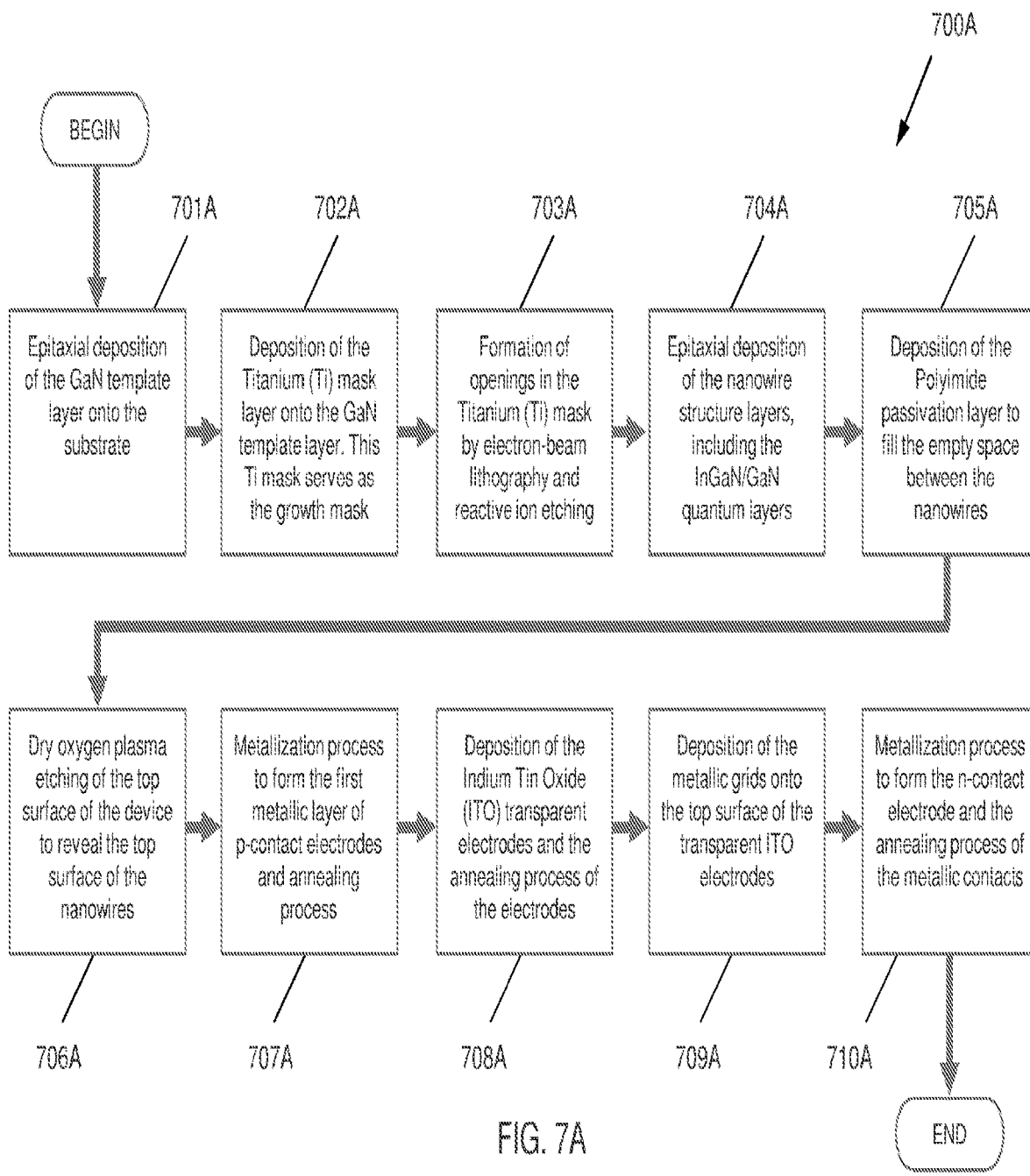
FIG. 7A is a flow chart illustrating a monolithically integrated fabrication process, in accordance with an example.
Figure 7B:
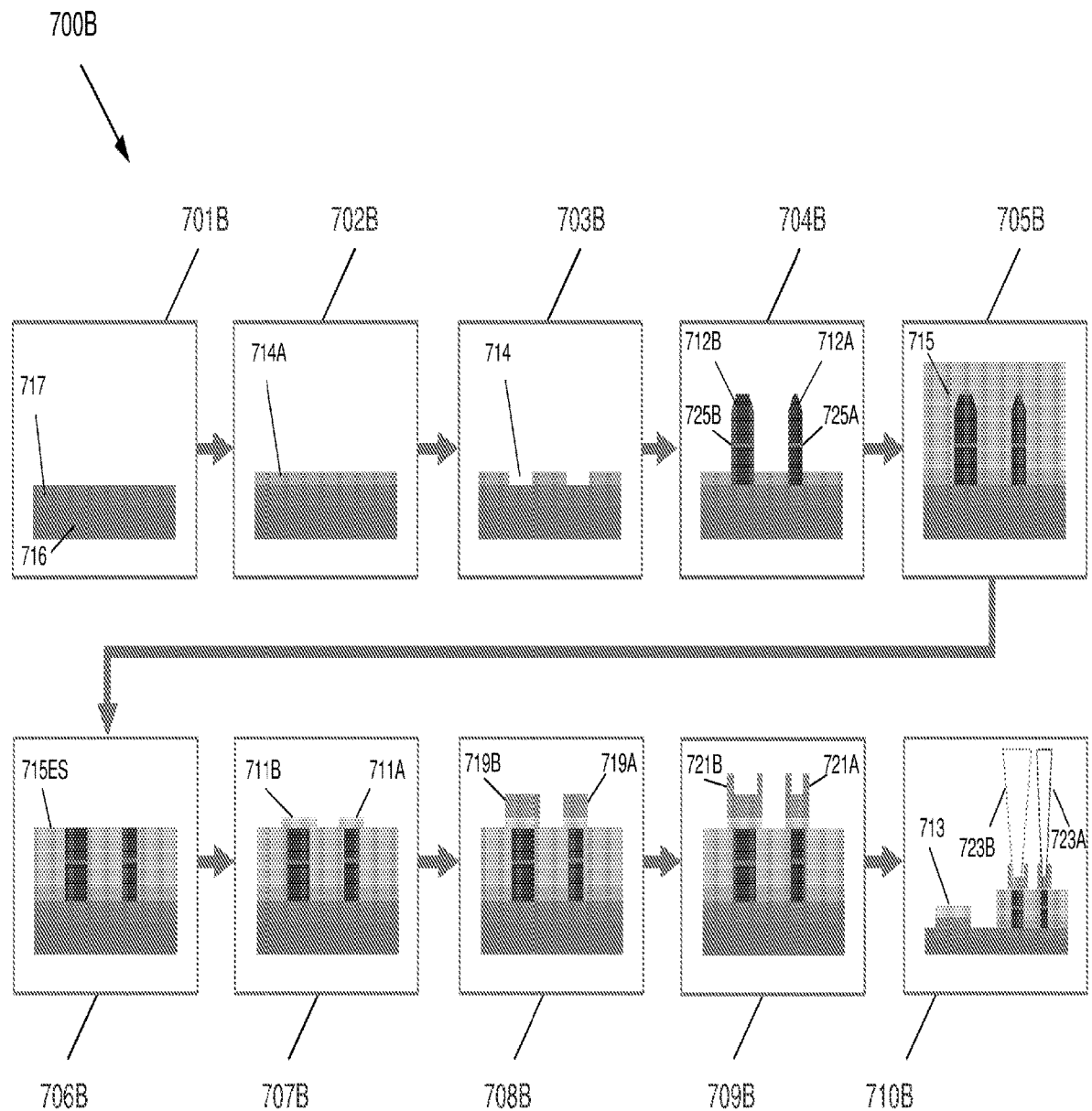
FIG. 7B is another illustrated of a monolithically integrate fabrication process for the nanowire cluster of FIG. 1A. Note that the dimensions and the various components are not drawn to scale here in FIG. 7B. Some of the dimensions have been exaggerated for the purpose of clarity and better demonstration of concepts. Only two nanowires are shown here because these are planar side views.

FIGS. 7A and 7B illustrate a process 700A and 700B of fabricating an InGaN/GaN quantum layer active region nanowire device. This process is shown in the flow chart illustration of FIG. 7A and in the multiple illustrations of FIG. 7B. A GaN template layer 717 is formed on a substrate 716 (701A and 701B), such as a sapphire substrate, for example using epitaxial deposition. A Ti mask 714A is then deposited on the GaN template layer (702A and 702B), using a metal deposition technique. At 703A and 703B, the Ti mask is patterned to dedicated openings corresponding to the location, shape, and cross-sectional dimensions of the various nanowires that will form a cluster. An electron beam lithography and reactive ion beam etching may be used to form the Ti mask pattern 714. Next, at 704A/704B, epitaxial deposition is performed to grow nanowires 712A and 712B, with active regions 725A and 725B respectively, through the patterned Ti mask 714.

A polyimide passivation layer 715 is deposited at 705A/705B to fill the empty space between the nanowires. This process is followed by dry oxygen plasma etching of the top surface of the device to reveal the top surface 715ES of the nanowires (706A and 706B). A metallization process forms a first/lower metallic layer 711A and 711B of p-contact electrodes and a subsequent annealing process is performed (707A and 707B). Indium Tin Oxide (ITO) transparent electrode 719A and 719B and an annealing process of electrodes is performed at 708A and 708B, followed by a deposition of metallic grids 721A and 721B onto the top surface of the transparent ITO electrodes at 709A and 709B. A metallization process forming the n-contact electrode 713 is performed and an annealing process of the metallic contacts is performed (710A and 710B). Shown are output emissions 723A and 723B, each at a different wavelength.

As illustrated in FIGS. 9A-9E, once the patterned Ti mask layer 914, with precisely defined openings 914A, is formed on top of the GaN coated substrate 926, the nanowires are grown in a step-by-step epitaxial crystal growth process through which the various layers of the nanowire are grown one on top of the other. These various multiple layers of the nanowire are depicted in the illustration of FIG. 2 which depicts the nanowire at the conclusion of the epitaxial growth process. An example process of forming a nanowire is shown in FIGS. 9A-9E.

The process starts by first growing the n-type GaN crystal layer 923A over the GaN coated substrate 926. The n-type GaN layer 923A is a relatively thick layer and in this example this n-type GaN layer is ~0.35 μm thick.

This relatively thick n-type GaN crystal layer 923A grows on top of the GaN coated substrate 926 only in the selected areas 914A that are not covered (masked) by the Ti mask 914 and these selected areas are the open holes 914A that have been created on the patterned Ti mask 914. The crystal layers of n-type GaN material 923A cannot take form over the areas of the substrate that are covered by the metallic Ti mask. Since the growth of the n-type GaN crystal takes place only over these selected area openings the process is referred to selective area growth (SAG) epitaxial process. This concept is schematically illustrated in FIGS. 8A, 8B and FIGS. 9A-9E.

Continuing with the epitaxial crystal growth process, and following the growth of this relatively thick n-type GaN layer relatively, relatively thin layers of InGaN/GaN quantum layers 925 are grown one at a time over the n-type GaN layer 923A. One thin layer of GaN is grown followed by a thin layer of InGaN on top of it and then another thin layer of GaN on top of this thin layer of InGaN. In this fashion, a multiple of InGaN and GaN layers 925 are grown one on top of the other just like the layers of a multi-layered sandwich. For example 5 or 6 interchanging InGaN and GaN layers could be grown to form 5 or 6 layers of quantum structures within which are embedded the quantum dot structures.

These multiple layers of InGaN/GaN comprise the active region 925 of the nanowire and they are neither n-type nor p-type, instead they are of intrinsic (pure) semiconductor variety and these InGaN/GaN layers do not include any dopant within them.

Once the multiple InGaN/GaN quantum layers 925 have fully formed on top of the relatively thick n-type GaN layer 923, on top of these intrinsic InGaN/GaN quantum layers 925 is grown a relatively thick layer of p-type GaN 924A, This thick p-type GaN layer 924A is sometimes referred to as the capping layer because it is situated on the top of the stack of layers. In this example this p-type GaN capping layer is ~15 μm thick. As the entire nanowire grows vertically upward eventually at the conclusion of this crystal growth process the top of these nanowires takes the form of a pyramid-shaped tips which are evident in the SEM image of FIG. 1B (626A, 626B, 626C, and 626D) and the illustration of FIG. 9E (924).

The thin multiple layers of intrinsic InGaN and GaN that form the active region of the nanowire are indicated in FIG. 2 and FIG. 9E collectively with the numerical indicator 925. Each of these thin InGaN/GaN layers are like thin disks that are stacked one on top of the other. However, moving from the center of the disk towards the outside perimeter of the disk one sees that the composition of the material that comprises this disk changes. Moving from the center of the disk towards the outside perimeter of the disk the concentration of Indium increases. In other words the areas of the disk that are closer to the perimeter of the disk are richer in the content of Indium and the areas closer to the center of the disk are not as rich in terms of Indium concentration. This process is illustrated in the drawings of FIGS. 5A, 5B, and 5C.

The area near the center of each InGaN/GaN disk forms an Indium deficient core which resembles a disk-shaped elements embedded at the core of the nanowire in the section that is comprised of InGaN/GaN layers. These disk-shaped elements, which are embedded within the core of the nanowire, form quantum dots. These quantum dots can take different sizes and shapes, for example, disks, arch-shaped structures, semi-polar planes, wells, dots, dots within wells, dots with a shell around them, spheres, or other similar forms and shapes or combination thereof. The SEM images in FIG. 6A and FIG. 6B depict show example quantum dot structures which in this example, are in the form of flat disks, arches, and semi-polar planes (625A, 625B, 625C, and 625B in FIG. 6A and FIG. 6B). That is, in the illustrated example, the nanowire having active region 625A is quantum dots that are flat-disk-shaped, as shown by 625A in both FIG. 6A and FIG. 6B. The slightly thicker nanowires having active region 625B has quantum dots having an arch shape. The yet thicker still nanowires having active regions 625C and 625D have quantum dotes having a semi-polar shape.

The precise shape and composition of these InGaN/GaN quantum dots can be designed through the process of designing the diameter of the nanowire. How the choice of the diameter of the nanowire affects the formation of these quantum dots within the InGaN/GaN layers was described earlier and is schematically illustrated in the drawings of FIGS. 5A, 5B, and 5C.

The composition of the InGaN layers with various concentrations of Indium is indicated by the term $In_xG_{1-x}N$. The proportion indicator x changes within the InGaN/GaN quantum layers as one moves from the center of the nanowire towards the perimeter of the nanowire. This change of x indicates a variation in the spatial composition of the nanowire and is what results in the appearance of quantum dot shaped formations that are embedded at the core of the active region of each nanowire.

A passivation layer of polyimide is applied (see, 705A and 705B in FIGS. 7A and 7B, respectively). The passivation layer may be formed of any suitable insulating polymer, other examples of which include SiOx, SiN, Al2O3, BN, etc. A dry oxygen plasma etching is performed (see, e.g., 706A and 706B) on the top surface of the passivation layer to review upper conduction surfaces of the nanowires. A metallization process is then applied to the top of each nanowire in the cluster, for example, by applying a p-contact conducting layer (or electrode), which may then be annealed (see, e.g., 707A and 707B). A Indium Tin Oxide (ITO) thin layer may then be deposited (see, e.g., 708A and 708B) to serve as a transparent electrode 719A or 791B and annealing process. Next a metallic grid layer is deposited on top of the ITO layer (see, e.g., 709A and 709B), and n-contact electrodes are formed through a metallization process (see, e.g., 710A and 710B), with annealing.

Figures 8A, 8B:
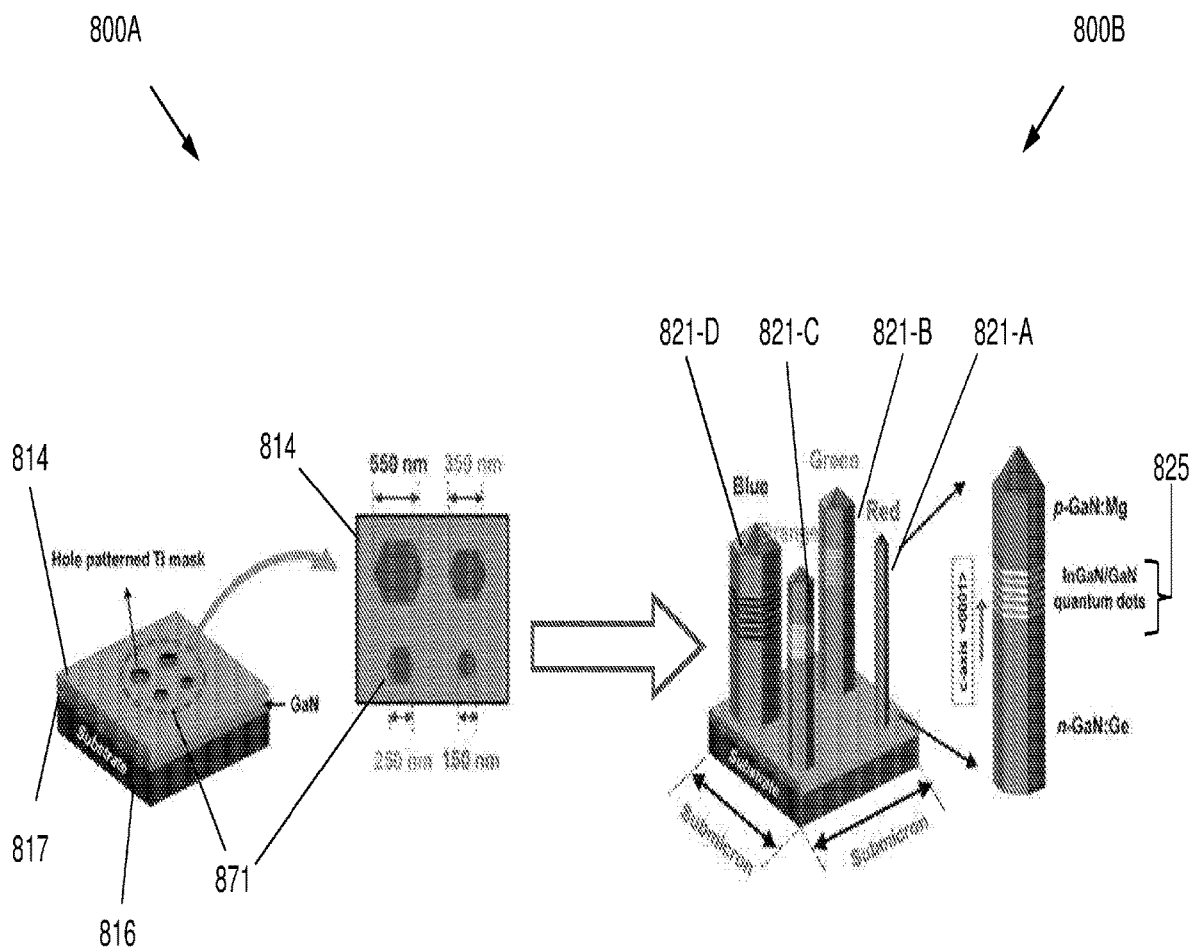
FIG. 8A is a schematic of a hole patterned titanium (Ti) mask showing the presence of hexagonal openings with different sizes, in accordance with an example.
FIG. 8B is a schematic showing selective area epitaxy of a monolithically integrated InGaN/GaN quantum layer nanowire cluster, in accordance with an example.

FIGS. 8A and 8B illustrate an example selective area epitaxy process for fabricating a full-color InGaN/GaN quantum nanowire cluster 800B, where different emission colors are achieved by varying the nanowire diameters in a single epitaxy step. In doing so, a patterned Titanium mask 814 has been deposited on a Sapphire substrate 816 that is coated with a GaN template layer 817. The openings 871 in the Titanium mask in this particular example are hexagonal shaped. Forming this patterned Titanium mask over Sapphire substrate structure 880A is the first part of the process of fabricating the nanowire structures.

In the illustrated example, the InGaN/GaN dot-in-nanowire LED structures 821A-821D, each include a 0.44 µm thick layer of n-GaN 223, six InGaN/GaN quantum layers each with quantum dot formations embedded within them and collectively forming the active layer 225, and a 0.15 µm thick layer of p-GaN 224. The structures 821A-821D were grown in a Veeco Gen II MBE crystal growth reactor system, which is one example of the type of systems that can be used for the fabrication of the nanowires. During the crystal growth process substrate temperature was set to a temperature of 965° C. and the Ga beam equivalent pressure (BEP) was set to $3.1 \times 10^{-7}$ Torr for Ge-doped GaN. The substrate temperature was reduced to 715° C. for the growth of the InGaN/GaN quantum dot active regions 825. The temperature numbers mentioned here refer to the thermocouple reading. The Indium (In) and Gallium (Ga) BEPs used for the growth of the quantum dot active regions were $2.1 \times 10^{-7}$ Torr and $3.2 \times 10^{-9}$ Torr, respectively. The growth conditions for the Mg-doped GaN layer included a Ga BEP of $3.1 \times 10^{-7}$ Torr, Mg BEP of $1.86 \times 10^{-9}$ Torr, and substrate temperature of 965° C., according with an example. Notice that the growth parameters are different from those used for single nanowire photoluminescence (PL) studies that were described earlier, and this is due to the use of a different MBE reactor system. Under these growth conditions in the Veeco Gen II MBE system, emission wavelengths across nearly the entire visible spectral range can be realized for nanowires with diameters varying from ~200 nm to ~600 nm.

FIG. 8A shows the illustrations of a patterned Ti mask 814 with opening holes 871 with sizes of ~150, ~250, ~350, and ~550 nm is shown. The lateral growth effect was also taken into account in the pattern design. As anticipated, due to this lateral growth effect, the diameter of the nanowires will be a bit larger than that the diameter of the hole patterns in the Ti mask. FIG. 8B shows the illustration of InGaN/GaN nanowires grown at four different diameters of ~220, ~320, ~420, and ~630 nm (nanowires 821A, 821B, 821C, and 821D, respectively). The nanowires have an average height of ~650 nm, with near perfect hexagonal morphology and smooth lateral surface, which can contribute to the enhanced light emission from the nanowire top surface. The nanowires exhibit nearly maximum light extraction efficiency.

Figure 10A:
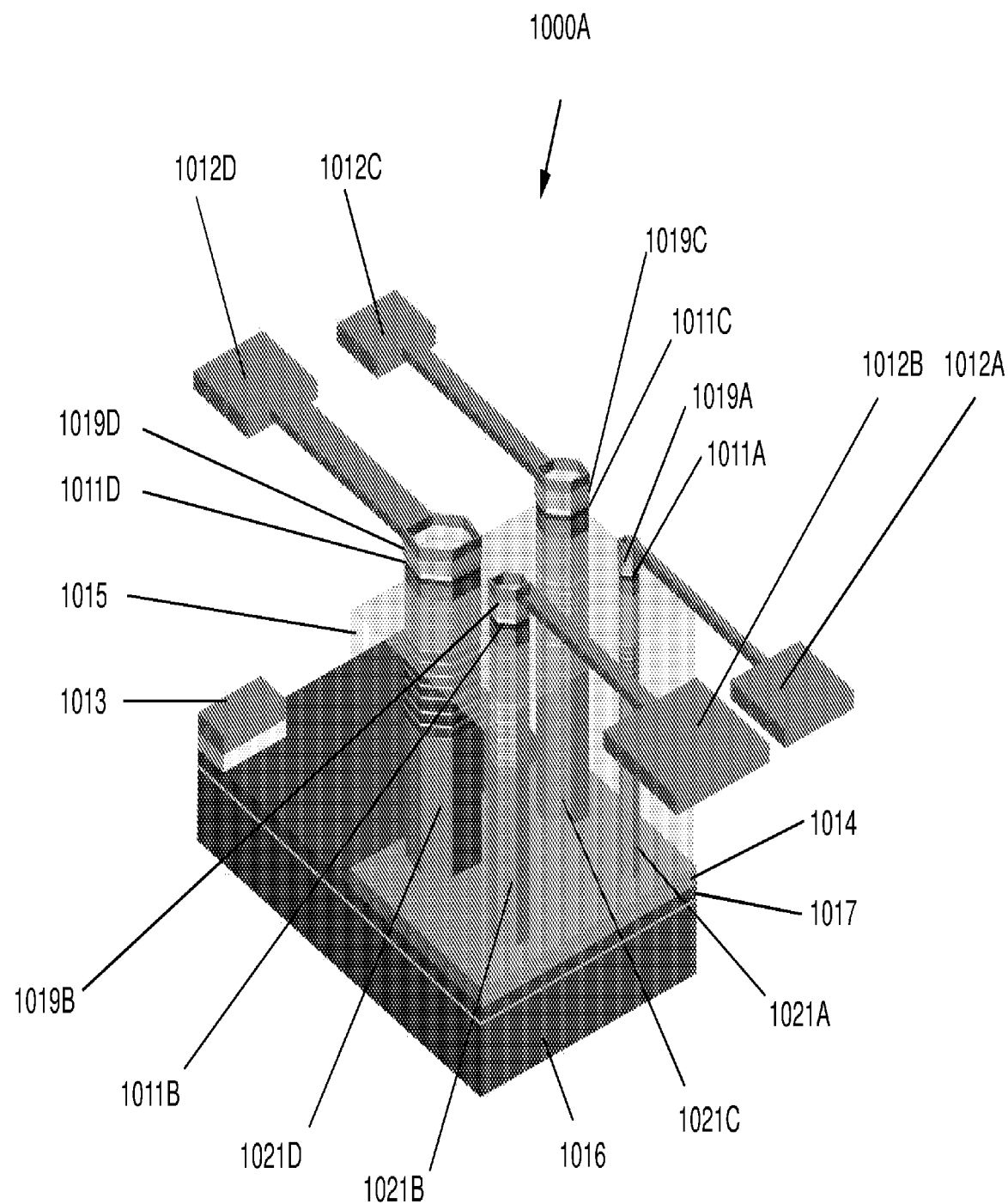
FIG. 10A illustrates four p-contact metallic electrodes attached separately and independently to four nanowires of an InGaN/GaN quantum layer nanowire cluster, in accordance with an example.

FIG. 10A illustrates a passivation and electrode formation that have been applied to the InGaN/GaN quantum nanowire cluster 1000A. A polyimide passivation resist layer 1015 was spin-coated to fully cover the nanowires 1021A-1021D, followed by oxygen plasma etching to reveal the top surface of nanowire. Nano-scale metal electrodes 1012A, 1012B, 1012C, and 1012D, including Ni (7 nm)/Au (7 nm) metal layers 1011A-1011D were then deposited on the p-GaN top surface of individual nanowires using electron-beam (e-beam) lithography and metallization techniques and then annealed at a temperature of ~500° C. for 1 min in nitrogen ambient. Subsequently, 100 nm thick Indium Tin Oxide (ITO) layers 1019A-1019D were deposited to serve as a transparent electrode. The complete devices with ITO contacts were annealed at a temperature of 300° C. for 1 h in vacuum. The entire structure was formed on top of a Sapphire substrate 1016 that is coated with a GaN template layer 1017 on top of which is deposited the patterned Titanium mask 1014, Note that the ITO layer is deposited on top of each nanowire by using e-beam (or photo) lithography, such that p-contact electrodes to neighboring nanowires are not shorted. This way, each nanowire pixel can be independently controlled.

Contact metal grids consisting of Ni (20 nm)/Au (100 nm) 1012A-1012D were then deposited on the ITO to facilitate electric current injection and device testing. Subsequently, a Ti (20 nm)/Au (100 nm) n-metal contact layer 1013 was deposited on the n-type GaN template 1017 and then annealed at a temperature of ~500° C. for 1 min in nitrogen ambient.

Figure 10B:
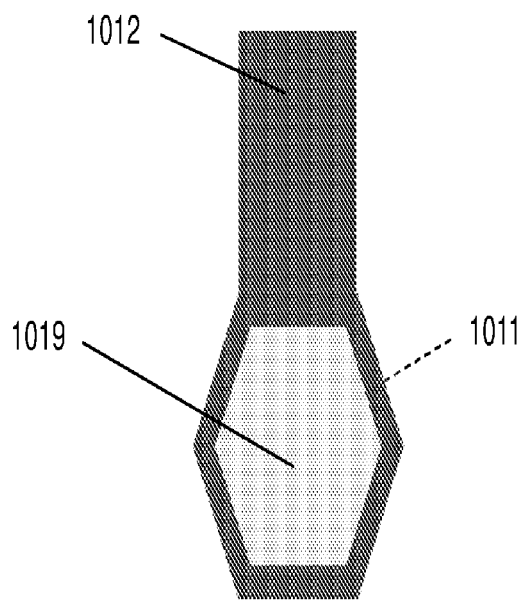
FIG. 10B is a top-view of a single p-contact metallic electrode with the relative position of the Indium Tin Oxide (ITO) transparent electrode, in accordance with an example.

FIGS. 10A and 10B illustrate four p-contact metallic electrodes (1012A-1012D which are collectively referred to as 1012) attached separately and independently to four nanowires (1021A-1021D which are collectively referred to as 1021) of an InGaN/GaN quantum layer nanowire cluster, in accordance with an example. Each electrode has three conductive layers. The first/lower layer is a relatively thin metallic layer 1011A-1011D (collectively referred to as 1011), typically comprising of Ni (7 nm)/Au (7 nm) in accordance with an example. On top of this thin Ni/Au metallic layer is deposited an Indium Tin Oxide (ITO) transparent conductive layer (1019A-1019B which are collectively referred to as 1019). On top of this ITO layer is deposited a metallic grid (1012A-1012B which are collectively referred to as 1012), typically comprising of Ni (20 nm)/Au (100 nm) in accordance with an example. This typically thicker layer 1012 of Ni/Au forms the top layer of the p-contact metallic electrode.

These three conductive electrode layers (1011, 1019, and 1012), as they are shown in FIGS. 10 and 10B, form the p-contact electrodes which are deposited over the nanowire structures 1021A-1021B which in FIG. 10B are collectively referred to as 1021. Also visible in this same drawing is the Polyimide passivation layer 1015 which fills the empty spaces between the nanowire structures.

Figure 11A:
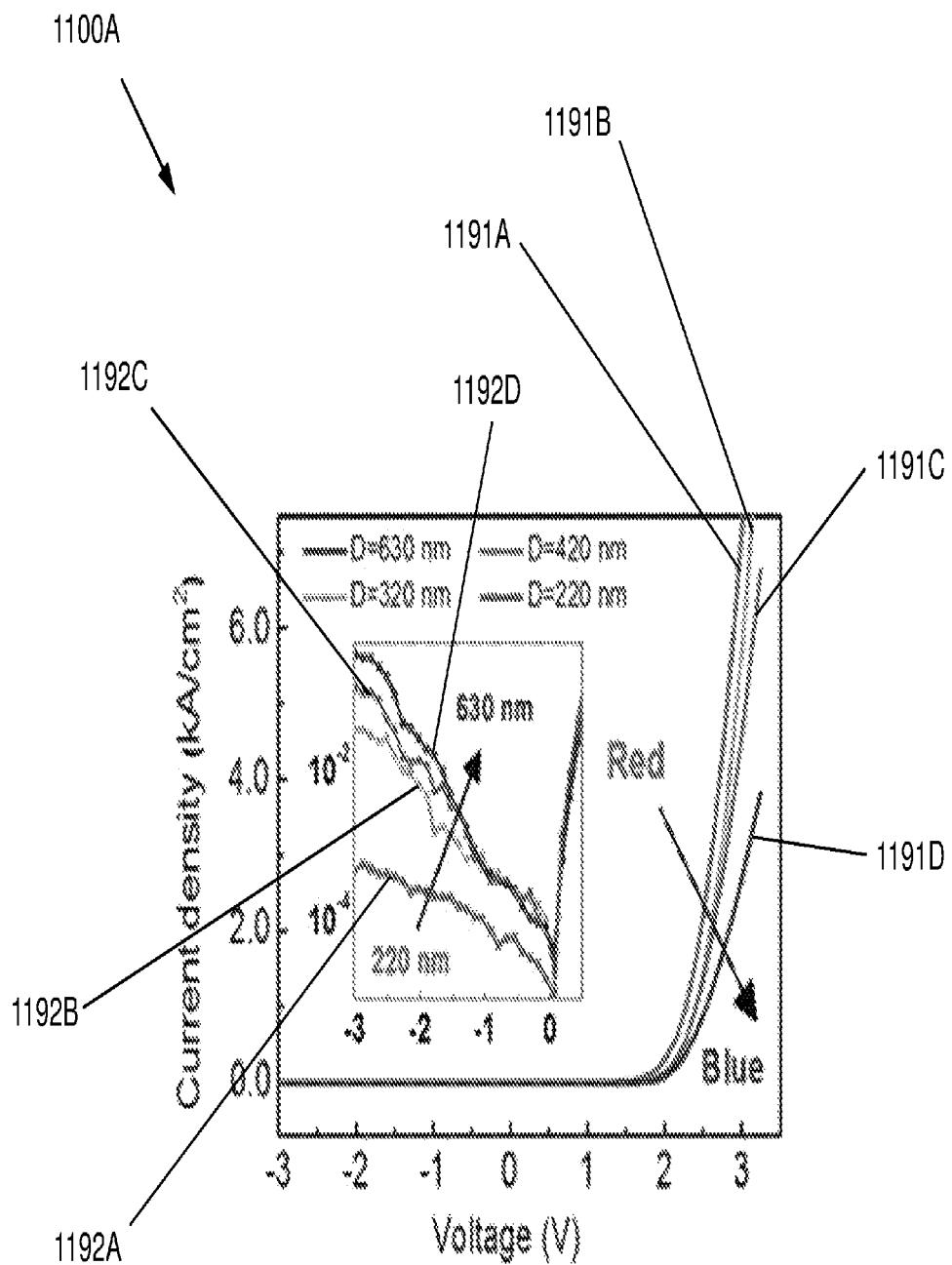
FIG. 11A is a plot of the current-voltage characteristics of InGaN/GaN quantum dot nanowires with different diameters, in accordance with an example. The inset shows current density versus voltage in a semi-log plot, showing increasing leakage current for nanowire LEDs with larger diameters.

Experimentally obtained performance characteristics plots of single stand-alone InGaN/GaN quantum dot nanowire LED devices were measured under continuous wave electrical biasing conditions at room-temperature. FIG. 11A shows representative current-voltage (I-V) curves of the blue emitting element (nanowire with diameter of D~630 nm), green emitting element (nanowire with diameter of D~420 nm), orange emitting element (nanowire with diameter of D~320 nm), and red emitting element (nanowire with diameter D~220 nm), which exhibit excellent current-voltage (I-V) characteristics. The nanowire LED devices have turn-on voltages of ~2 V, which is significantly better than previously reported ensemble nanowire LEDs and GaN-based planar devices.

FIG. 11A shows the current-voltage (I-V) characteristics curves (1191A, 1191B, 191C, and 1191D) of single InGaN/GaN quantum dot nanowires with different diameters. The inset of FIG. 11A shows current density versus voltage curves (1192A, 1192B, 1192C, 1192D) in a semi-log plot, showing increasing leakage current for nanowire LEDs with larger diameters.

Figure 11B:
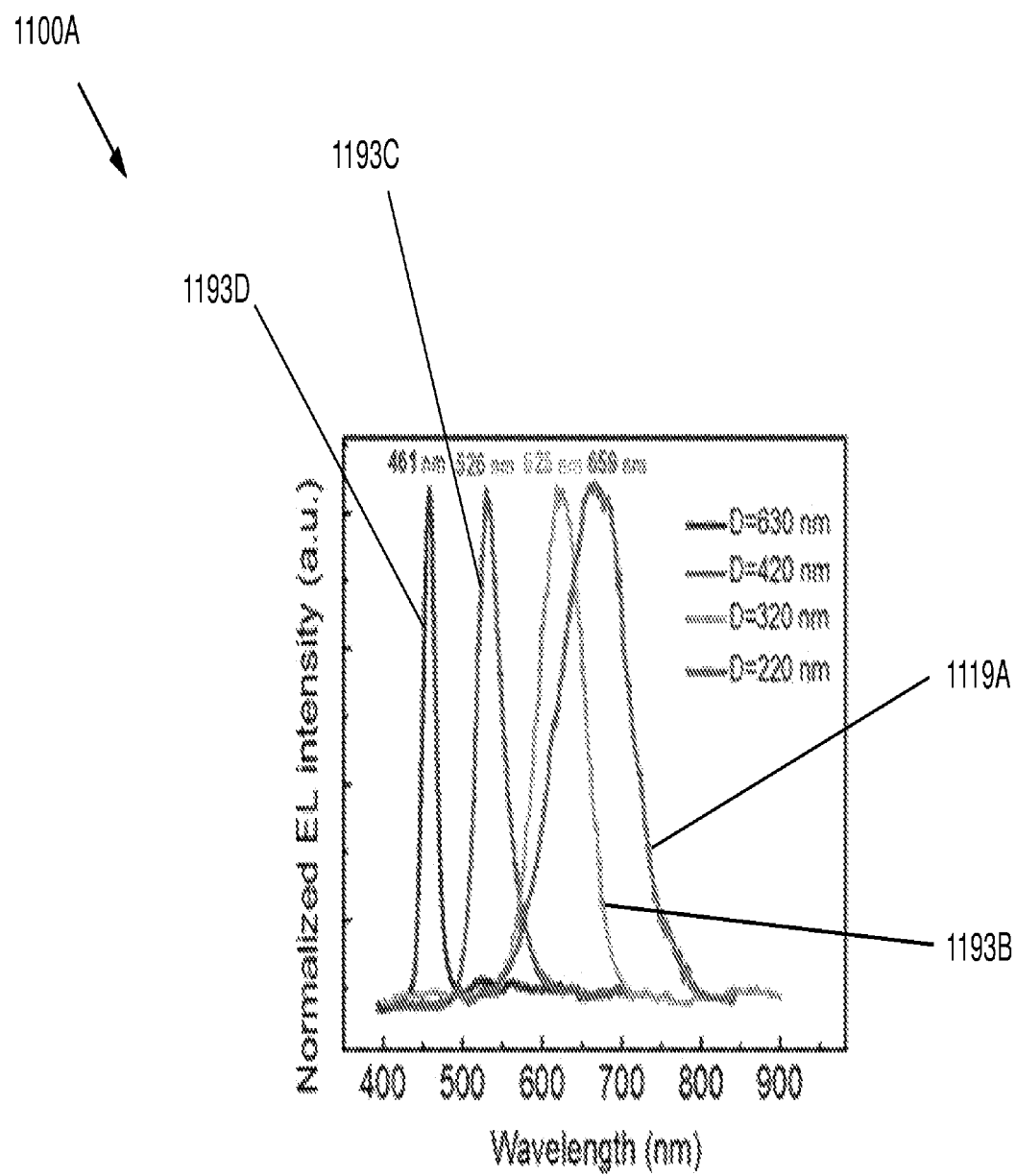
FIG. 11B is a plot of the electroluminescence (EL) spectra versus wavelength for InGaN/GaN quantum dot nanowires with different diameters, in accordance with an example.

FIG. 11B shows the electroluminescence (EL) spectra curves (1193A, 1193B, 1193C, and 1193D) of single stand-alone nanowire LED elements each with a different diameter. FIG. 110 shows the light-current characteristics (L-I) curves (1194A, 1194B, 1194C, and 1194D) of single stand-alone nanowire LED elements each with a different diameter. The inset shows the EL spectra curves (1195A, 1195B, 1195C, and 1195D) measured under different injection current densities (1.3-6.5 kA/cm2) for the green-emitting single stand-alone nanowire LED element.

Current densities as high as 7 kA/cm$^2$ were measured at ~3 V. It is also noticed that higher current densities can be achieved in nanowire LEDs with smaller diameters. This is largely due to the significantly enhanced dopant incorporation in smaller diameter nanowires and the resulting efficient current conduction, as well as the more efficient heat dissipation. The capacity for sustaining higher current densities with decreasing device area has also been reported previously. These results suggest that single nanowire optoelectronic and electronic devices can handle unusually large current densities and can deliver extremely high power density compared to conventional planar devices. As shown the leakage current under reverse bias is relatively small but increases with increasing nanowire diameter, shown in the inset of FIG. 11A as curves indicated by 112-A, 112-B, 112-C, and 112-D, which is likely due to the presence of defects in large diameter nanowires and the resulting current leakage.

Figure 11C:
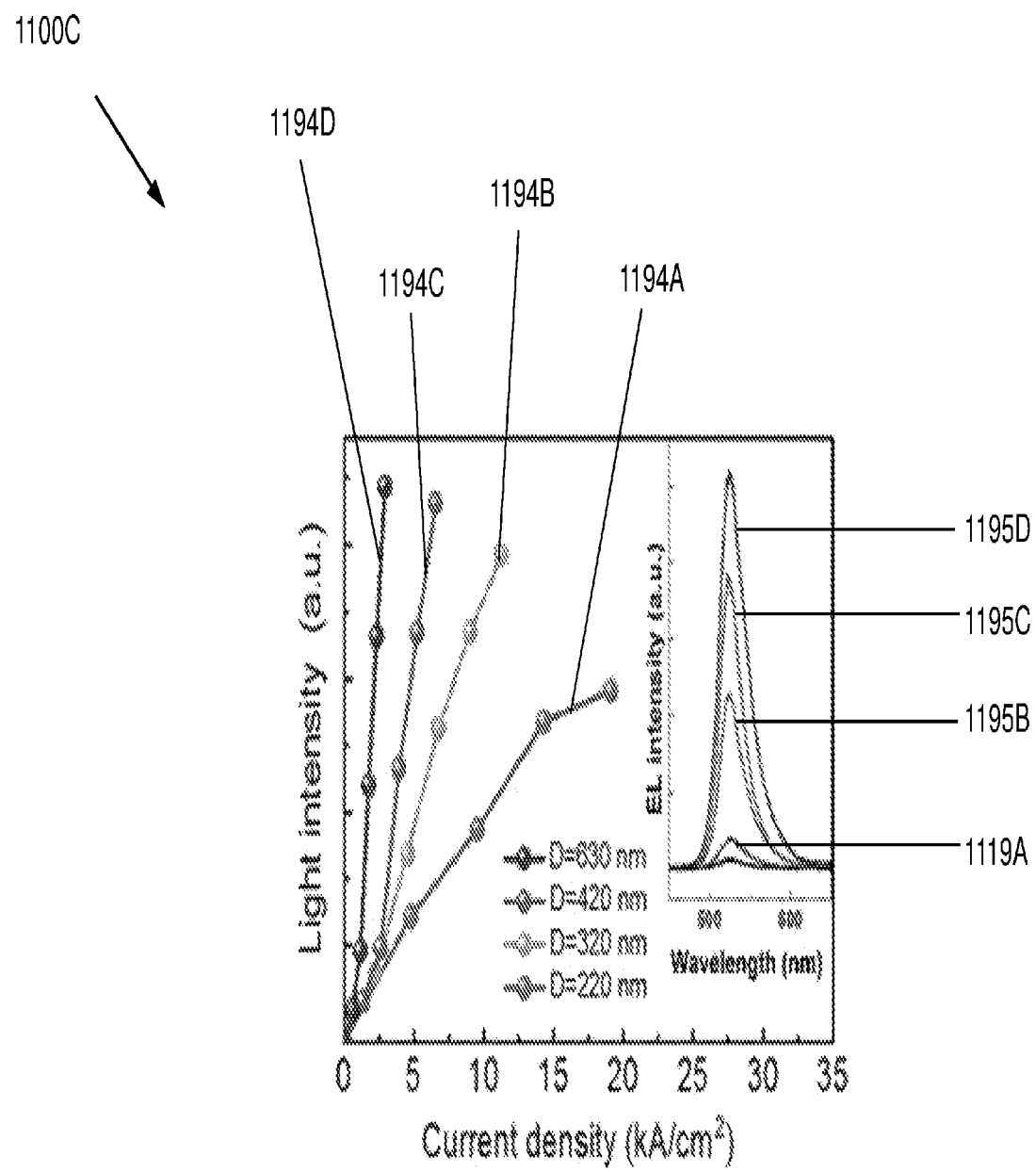
FIG. 11C is a plot of the light-current characteristics of InGaN/GaN quantum dot nanowires with different diameters, in accordance with an example. The inset shows the EL spectra measured under different injection current densities (1.3-6.5 kA/cm2) for the green-emitting nanowires.

Single nanowire LEDs also exhibit excellent light emission characteristics. The electroluminescence (EL) emission was collected using an optical fiber coupled to a high-resolution spectrometer and detected by a charge coupled device (CCD). Shown in FIG. 11B are the EL emission spectra curves (1193A, 1193B, 1193C, and 1193D) of single nanowire LED sub-pixels with diameters of ~220 nm, ~320 nm, ~420 nm, and ~630 nm, which exhibit peak emission wavelengths of 659 nm, 625 nm, 526 nm, and 461 nm, respectively. The spectra were taken at an injection current of approximately 4.5 µA. Light-current (L-I) characteristics curves (1195A, 1195B, 1195C, and 1195D) of the red, orange, green, and blue single nanowire LED sub-pixels are shown in FIG. 11C. As shown the light intensity increases near-linearly with injection current for different nanowire LEDs. Stronger light intensity was measured from nanowires with larger diameters under the same injection current density, due to the larger active region area. On the other hand, nanowire LED sub-pixels with smaller diameters can handle higher current density, due to the more efficient current conduction and heat dissipation.

Shown in the inset of FIG. 11C are the four EL spectra curves (1195A, 1195B, 1195C, and 1195D) of the green-emitting nanowire LED pixel. There is no significant shift in the emission peak position with increasing injection current, suggesting a small level of quantum-confined Stark-effect, due to the highly efficient strain relaxation of nanowires. It is also worthwhile mentioning that, by engineering the nanowire diameter and height, single nanowire LEDs can offer significantly higher light extraction efficiency and more controllable emission pattern, compared to conventional planar LEDs.

Moreover, it is further expected that, with the incorporation of p-AlGaN electron blocking layer and core-shell schemes, the performance of single InGaN/GaN nanowire LEDs can be dramatically improved by reducing non-radiative surface recombination and carrier leakage and overflow.

In summary, the present techniques have demonstrated multicolor, single stand-alone nanowire LED photonic devices on the same chip by using the special technique of single-step selective area epitaxy. Compared to conventional planar devices, such nanowire LED devices offer several distinct advantages, including significantly reduced dislocation density and polarization fields, enhanced light extraction efficiency, controllable radiation pattern, tunable emission, and extremely efficient current conduction and heat dissipation. Moreover, due to the extremely small size of these devices and reduced capacitance, such nanowire devices also promise ultra-high speed frequency response. The methods and devices demonstrated here provide a unique approach for the realization of tunable, full-color nano-scale optoelectronic devices for a broad range of applications, including ultra-fine imaging and projection display, lighting, communication, sensing, and medical diagnostics on a single chip.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as an example only and does not describe every possible embodiment, as describing every possible embodiment would be impractical, if not impossible. One could implement numerous alternate embodiments, using either current technology or technology developed after the filing date of this application.

What is claimed:

1. A device, comprising:
a plurality of nanowires comprising nanowires having different effective diameters and coupled to a substrate, each nanowire of the plurality of nanowires comprising a quantum structure comprising a first group III element and a second group III element;
wherein the quantum structure of said each nanowire is formed by a process comprising:
directing beams comprising a beam comprising the first group III element and a beam comprising the second group III element at the substrate, wherein atoms of the first group III element incorporated into the nanowires diffuse at different rates than atoms of the second group III element incorporated into the nanowires, wherein a first nanowire of the nanowires having an effective diameter greater than an effective diameter of a second nanowire of the nanowires has a concentration of the second group III element less than a concentration of the second group III element in the second nanowire.

2. The device of claim 1, wherein said directing the beams comprises applying the beam of the second group III element at a constant beam equivalent pressure across the substrate.

3. The device of claim 1, wherein the first group III element is gallium, and wherein the semiconductor is gallium nitride.

4. The device of claim 1, wherein the second group III element is indium.

5. The device of claim 1, wherein the quantum structure is a quantum active layer structure comprising alternating layers of indium gallium nitride and gallium nitride.

6. The device of claim 1, wherein said each nanowire comprises an element of a light emitting diode, said each nanowire further comprising:
a first portion comprising a semiconductor comprising the first group III element; and
a second portion comprising the semiconductor comprising the first group III element and doped to be p-type;
wherein the quantum structure is between the first portion and the second portion.

7. The device of claim 1, wherein the quantum structure is a quantum active layer structure comprising layers of quantum dots, wherein the quantum dots in the second nanowire are aligned along the longitudinal axis of the second nanowire, and wherein the quantum dots in the first nanowire are distributed in a semi-polar plane of the first nanowire.

8. The device of claim 1, wherein the plurality of nanowires comprises nanowires with a cross-section having a shape selected from the group consisting of: cylindrical, hexagonal, rectangular, and triangular.

9. The device of claim 1, wherein the plurality of nanowires comprises nanowires configured to emit light at a wavelength in one or more spectral ranges selected from the group consisting of: a blue spectral range; a red spectral range; a green spectral range, and an orange spectral range.

10. The device of claim 1, wherein the plurality of nanowires are grown simultaneously in a single epitaxy step of the process.

* * * * *